(12) United States Patent
Momono et al.

(10) Patent No.: US 9,373,654 B2
(45) Date of Patent: Jun. 21, 2016

(54) SOLID-STATE IMAGING DEVICE, LAYOUT DATA GENERATING DEVICE AND LAYOUT DATA GENERATING METHOD

(71) Applicant: RENESAS ELECTRONICS CORPORATION, Kanagawa (JP)

(72) Inventors: Hiroyuki Momono, Kanagawa (JP); Nobuo Tsuboi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/529,061

(22) Filed: Oct. 30, 2014

(65) Prior Publication Data
US 2015/0123229 A1   May 7, 2015

(30) Foreign Application Priority Data
Nov. 7, 2013   (JP) ................................ 2013-231537

(51) Int. Cl.
*H04N 5/335* (2011.01)
*H01L 27/146* (2006.01)
*G06F 17/50* (2006.01)

(52) U.S. Cl.
CPC ...... *H01L 27/14623* (2013.01); *G06F 17/5072* (2013.01); *G06F 17/5081* (2013.01); *H01L 27/14621* (2013.01); *H01L 27/14645* (2013.01)

(58) Field of Classification Search
CPC ................................................ H01L 27/14603
USPC ........................... 348/275; 257/432; 716/122
See application file for complete search history.

(56) References Cited

U.S. PATENT DOCUMENTS 8,614,759 B2   12/2013   Watanabe et al.

FOREIGN PATENT DOCUMENTS

| JP | 2005-229460 A | 8/2005 |
| JP | 2010-219453 A | 9/2010 |
| JP | 2010-232595 A | 10/2010 |

*Primary Examiner* — Joel Fosselman
(74) *Attorney, Agent, or Firm* — McDermott Will & Emery LLP

(57) ABSTRACT

A solid-state imaging device includes pixels respectively having photoelectric conversion units and arranged in matrix in basic pattern units, and an optical member arranged on the incidence side of incident light than the pixels and having constituent elements respectively corresponding to the pixels. The pixels include first, second and third wavelength range light pixels. Each basic pattern is comprised of a combined arrangement pattern of the wavelength range light pixels. Misregistration constituent elements with the occurrence of misregistration exist in the constituent elements. The misregistration increases toward the misregistration constituent elements separated from a center position of a pixel array of the pixels. The misregistration of the misregistration constituent element for the first wavelength range light pixel and that of the misregistration constituent element for the third wavelength range light pixel are smaller and larger than that of the misregistration constituent element for the second wavelength range light pixel, respectively.

18 Claims, 20 Drawing Sheets

FIG. 21

CALCULATE INTEGER DATA (Ix_nx, Iy_ny)
$\begin{pmatrix} Ix\_nx = \text{ROUNDUP}(xd\_nx) \\ Iy\_ny = \text{ROUNDUP}(yd\_ny) \end{pmatrix}$ — S304

FIG. 22

CALCULATE INTEGER DATA (Ix_nx, Iy_ny)
$\begin{pmatrix} Ix\_nx = \text{ROUNDOFF}(xd\_nx) \\ Iy\_ny = \text{ROUNDOFF}(yd\_ny) \end{pmatrix}$ — S404

SOLID-STATE IMAGING DEVICE, LAYOUT DATA GENERATING DEVICE AND LAYOUT DATA GENERATING METHOD

CROSS-REFERENCE TO RELATED APPLICATIONS

The disclosure of Japanese Patent Application No. 2013-231537 filed on Nov. 7, 2013 including the specification, drawings and abstract is incorporated herein by reference in its entirety.

BACKGROUND

The present invention relates to a solid-state imaging device, a layout data generating device and a layout data generating method, and, for example, to a solid-state imaging device including a plurality of pixels and optical members, and a layout data generating device and method for generating layout data indicative of a layout arrangement of each optical member.

A technology related to a CCD line sensor equipped with a plurality of photodetecting units that read reflected light of an original document focused by an image forming lens has been described in Japanese Unexamined Patent Application Publication No. 2005-229460 (Patent Document 1). Specifically, there has been described in Patent Document 1, a technology that adjusts an arrangement interval between the photodetecting units with respect to a photodetecting position to be originally image-formed, based on the amount of misregistration of a photodetecting position actually image-formed through an image forming lens.

There has been described in Japanese Unexamined Patent Application Publication No. 2010-219453 (Patent Document 2), a technology that makes an interval between vertical CCD sections on both sides of a first pixel that receives light in a long wavelength range, larger than an interval between vertical CCD sections on both sides of a second pixel that receives light in a short wavelength range.

There has been described in Japanese Unexamined Patent Application Publication No. 2010-232595 (Patent Document 3), a technology related to a unit pixel having a waveguide comprised of a columnar body constant in cross-sectional area from its incoming end to its outgoing end, and a microlens that guides incident light to the incoming end of the waveguide. Specifically, in the unit pixel in Patent Document 3, the waveguide is arranged in such a manner that the center of the flux of the incident light incident to the incident end surface of the waveguide from the microlens and the center axis of the waveguide coincide with each other.

RELATED ART DOCUMENTS

Patent Document

[Patent Document 1] Japanese Unexamined Patent Application Publication No. 2005-229460
[Patent Document 2] Japanese Unexamined Patent Application Publication No. 2010-219453
[Patent Document 3] Japanese Unexamined Patent Application Publication No. 2010-232595

SUMMARY

For example, a solid-state imaging device typified by a CMOS image sensor or a CCD sensor receives light condensed by an image forming lens and thereby captures an image corresponding to a subject. The solid-state imaging device has, for example, a plurality of pixels arranged in a matrix form. Since light incident to a pixel disposed at the center of an effective pixel region passes through the center of the image forming lens, the light enters straight a photodetecting unit (photodiode) without refraction. On the other hand, in each pixel arranged in the outer periphery of the effective pixel region, the incident light is refracted and obliquely made incident to the photodiode because it passes through the outer circumferential portion of the image forming lens.

Thus, in the pixels arranged in the outer periphery of the effective pixel region, there is a risk of reducing the sensitivity of the solid-state imaging device due to the shielding of incident light desired to be originally taken in the photodiode in a light shielding zone arranged to prevent leakage of light into adjacent photodiodes or cell transistor regions, a boundary region between microlenses, a boundary region between color filters, etc. That is, there is room for improvement in the solid-state imaging device in terms of improving its photosensitivity.

Other objects and novel features will become apparent from the description of the present specification and the accompanying drawings.

A solid-state imaging device in one embodiment includes first constituent elements of an optical member arranged corresponding to a first pixel that receives long wavelength range light therein, and second constituent elements of the optical member arranged corresponding to a second pixel that receives short wavelength range light therein. In each of the first constituent elements, first misregistration occurs with respect to a photodetecting unit for the first pixel. In each of the second constituent elements, second misregistration occurs with respect to a photodetecting unit for the second pixel. At this time, in a plurality of first pixels, a first misregistration amount increases toward the first pixels arranged outside. In a plurality of second pixels, a second misregistration amount increases toward the second pixels arranged outside. Further, in the first and second pixels included in the same basic patterns, the second misregistration amount becomes larger than the first misregistration amount.

According to one embodiment, it is possible to improve the photosensitivity of a solid-state imaging device.

BRIEF DESCRIPTION OF THE DRAWINGS

FIG. 21 is a part of a flowchart showing processing of an integer operation unit in a modification 1;

FIG. 22 is a part of a flowchart showing processing of the integer operation unit in a modification 2;

DETAILED DESCRIPTION

Figure 1:
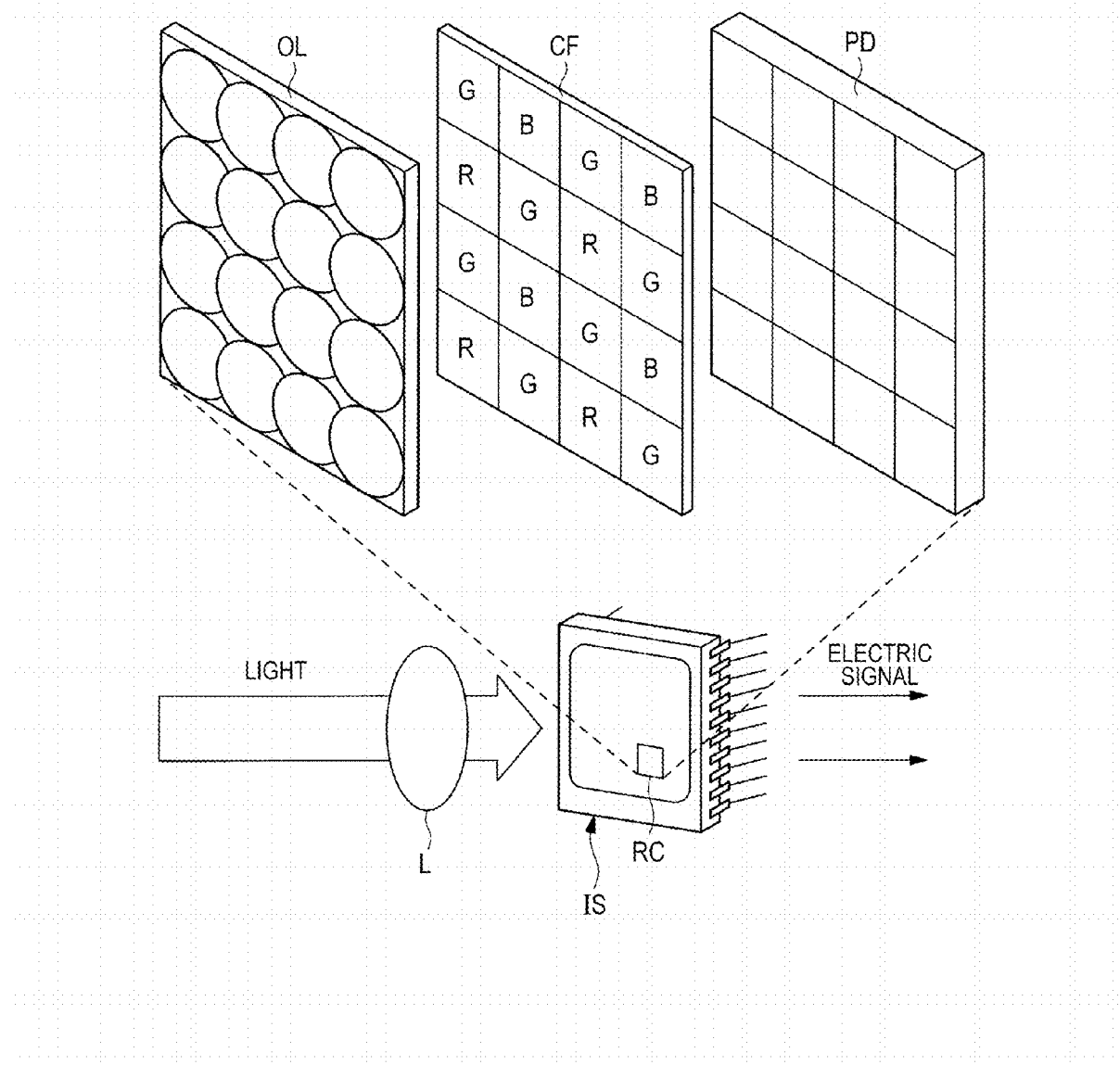
FIG. 1 is a typical diagram showing the manner in which light is converted into an electric signal in an image sensor.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations, etc. of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that constituent elements or components (including element steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan diagrams may be hatched for clarity of illustration.

(Embodiment 1)<Schematic Configuration of Image Sensor (Solid-State Imaging Device)>

In the present embodiment 1, a description will be made of an image sensor for imaging or obtaining an image with reference to the accompanying drawings. A schematic configuration of the image sensor will first be described. The image sensor is a device that converts light inputted to the image sensor into an electric signal. FIG. 1 is a typical diagram showing the manner in which the light is converted into the electric signal in the image sensor. For example, as shown in FIG. 1, light emitted from an object is made incident on a lens L to form an image. The image sensor IS is disposed at an image forming position of the lens L. The image focused by the lens L is irradiated to the image sensor IS. When light is irradiated to the image sensor IS, the image sensor IS converts the light into an electric signal. Then the electric signal outputted from the image sensor IS is signal-processed to thereby generate an image. Thus, the image sensor IS has the function of converting the incident light into the electric signal and outputting the same.

Enlarging the photodetecting surface RC of the image sensor IS makes it understand that a microlens OL, a color filter CF and a photodiode PD have been arranged in the photodetecting surface RC of the image sensor IS. That is, it is understood that the image sensor IS has the microlens OL, the color filter CF and the photodiode PD. The functions of respective constituent elements that configure the image sensor IS will hereinafter be sequentially described.

Configuration and Function of Microlens

Figure 2:
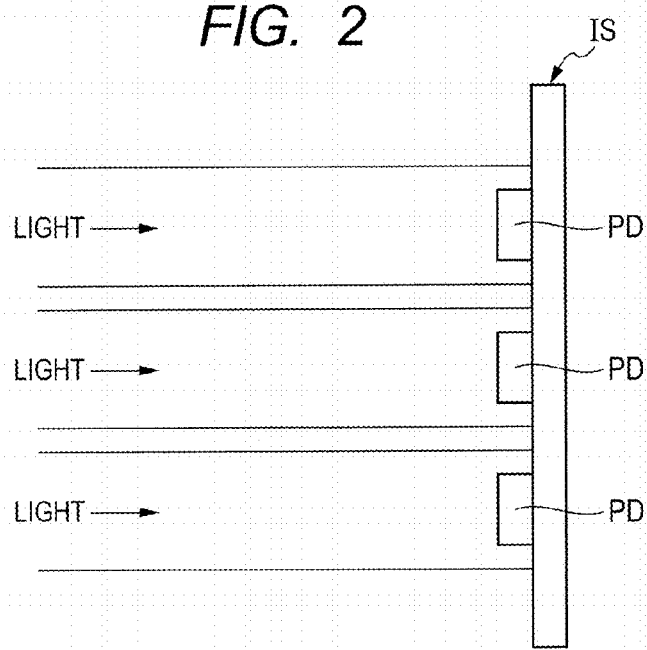
FIG. 2 is a diagram schematically illustrating a configuration when a microlens is not provided in the image sensor.

A description will first be made about the microlens OL. FIG. 2 is a diagram schematically showing a configuration where no microlens OL is provided in the image sensor IS. When the microlens OL is not provided in the image sensor IS as shown in FIG. 2, light incident on the image sensor IS is irradiated not only to each photodiode PD disposed in the photodetecting surface of the image sensor IS, but also a peripheral region of the photodiode PD. That is, the photodiodes PDs are arranged in an array form in the photodetecting surface of the image sensor IS, but the individual photodiodes PDs are arranged through a predetermined gap therebetween. Accordingly, the light incident on the image sensor IS is not made incident on each photodiode PD all, but is irradiated even to the gap between the photodiodes PDs.

The light incident on the photodiode PD can be converted into an electric signal, but the light incident to the gap between the photodiodes PDs cannot be converted into the electric signal because the light is not irradiated to the photodiode PD. That is, the light incident to the gap between the adjacent photodiodes PDs becomes wasteful. Accordingly, the image sensor IS is preferably configured such that the light incident to the image sensor IS can be converted into the electric signals as much as possible. It is however understood that when no microlens OL is provided in the image sensor IS, the light wasted without being converted into the electric signals by the image sensor IS will increase.

As a method for solving it, there is considered that the photodiodes PDs are arranged without any gap therebetween. Since it is however necessary to provide a scanning circuit for transferring an electric charge converted by each individual photodiode PD, etc., gaps always exist between the photodiodes PDs. For example, when the image sensor IS is formed by one large photodiode PD, the gap at its photodetecting surface can be eliminated, but the resolution of an image cannot be obtained in this case. Therefore, in order to improve the resolution of the image, there is a need to arrange a plurality of small photodiodes PDs independent of each other in the photodetecting surface as much as possible. In this case, it is necessary to independently convert electric charges from the respective photodiodes PDs into electric signals. It is necessary to provide gaps (insulation regions) corresponding to predetermined intervals in such a manner that the individual photodiodes PDs are electrically independent from each other. Accordingly, since the predetermined gap occurs between the individual photodiodes PD, it is hard to completely eliminate the gap between the photodiodes PDs.

Figure 3:
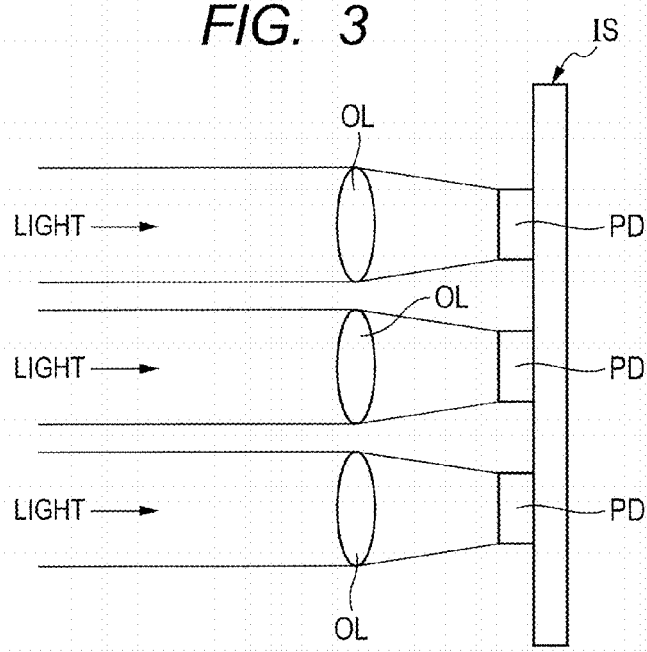
FIG. 3 is a typical diagram depicting an example in which a microlens is arranged in front of each photodiode.

Therefore, in order to efficiently convert the light incident to the image sensor IS into the electric signal, the image sensor IS has been provided with microlenses OLs. FIG. 3 is a typical diagram showing an example in which microlenses OLs are respectively arranged in front of photodiodes PDs. As shown in FIG. 3, the microlenses OLs are respectively arranged in association with the photodiodes PDs. That is, the microlenses OLs are arranged by the same number as the number of the photodiodes PDs. As shown in FIG. 3, light incident to the image sensor IS enters into each microlens OL. The light incident on each microlens OL is focused and irradiated onto the photodiode PD. Thus, the microlens OL has the function of causing the light incident to the image sensor IS to converge and applying the light onto the photodiode PD. That is, when no microlens OL is provided, the light irradiated to the gap between the photodiode PDs without being made incident onto the photodiode PDs is also made incident to the photodiodes PD by refraction by providing the microlenses OL. That is, the microlens OL has the function of causing the incident light to converge and irradiating the light onto each photodiode PD. Thus, since the light incident to the gap between the photodiodes PDs can be focused onto the photodiode PD by providing each microlens OL in the image sensor IS, the light incident to the image sensor IS can efficiently be converted into the electric signal.

Configuration and Function of Color Filter

Figure 4:
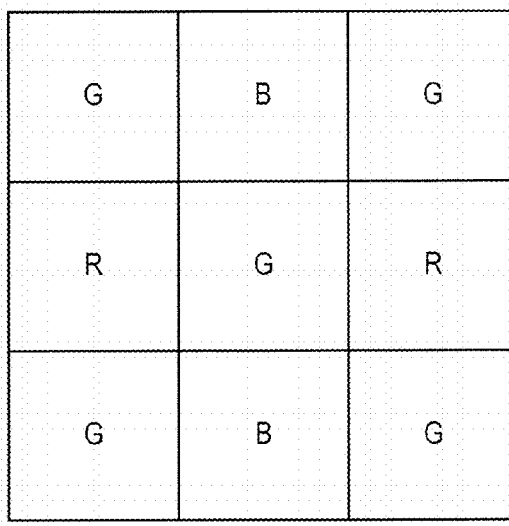
FIG. 4 is a diagram showing a primary color filter that is one of color filters.

The color filter CF will subsequently be described. Originally, the photodiode PD to convert the light into the electric signal have no function of distinguishing between colors and can only distinguish the brightness/darkness of the color. Accordingly, images photographed by the image sensor are all made monochrome in the case of the mere photodiode PD. Therefore, the image sensor IS is provided with the color filter CF so as to be capable of generating a color image. The human eyes also feel only the three primary colors of "red", "green" and "blue", but feel all colors by adjusting the quantity of light of these three primary colors. This is called "additive color mixture by three primary colors of light". For example, if "red" and "green" are the same in light quantity, "yellow" is produced. That is, in a state in which "red" and "green" are identical in the quantity of light and the quantity of "blue" light is absent, a yellow color which is a complementary color of "blue" is produced. Then, when the "red", "green" and "blue" are made identical in light quantity, a white color is produced. On the other hand, when all the quantities of "red", "green" and "blue" lights are absent, a black color is produced. A color filter CF shown in FIG. 4 is illustrated as one using this principle. A primary color filter is shown in FIG. 4, which is one color filter CF. The primary color filter is a filter that uses the three primary colors of RGB (Red, Green and Blue). By disposing the primary color filter in front of the photodiodes PDs, the photodiodes PDs corresponding to the respective colors can be provided. For example, a photodiode PD with a red filter placed in front thereof detects the quantity of light for the red color. A photodiode PD with a green filter placed in front thereof detects the quantity of light for the green color. Further, a photodiode PD with a blue filter placed in front thereof detects the quantity of light for the blue color. It is possible to realize various colors according to the light quantity of the photodiode PD for the red color, the light quantity of the photodiode PD for the green color, and the light quantity of the photodiode PD for the blue color.

Incidentally, the red filter, the green filter and the blue filter that configure the color filter CF are arranged using as a unit, a basic pattern typified by a Bayer array shown in FIG. 4, for example without simply arranging them. That is, the color filter CF is configured by repeating the basic pattern in which the red, green and blue filters are combined.

The primary color filter using the three primary colors of RGB is good in color reproducibility in an image, but has a side effect that it is weak to the photography at a dark place where the sensitivity of the image sensor IS is not so good. Therefore, the primary color filter is often used in a large-sized image sensor IS good in sensitivity.

Figure 5:
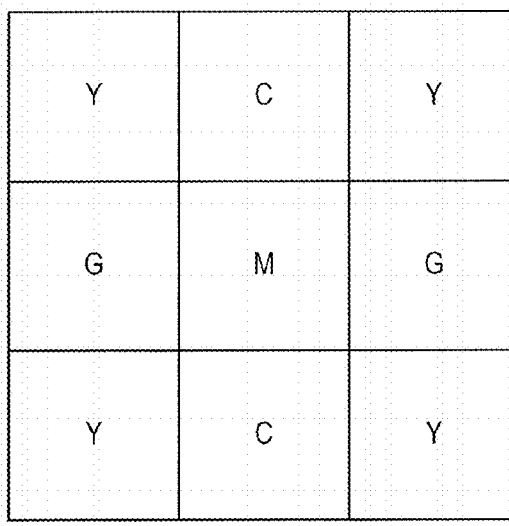
FIG. 5 is a diagram illustrating a complementary color filter that is one of color filters.

On the other hand, there is one called a "complementary color filter" in addition to the primary color filter using the three primary colors of RGB as the color filter CF. The complementary color filter is comprised of four kinds of colors with Green (G) added to Cyan (C), Magenta (M) and Yellow (Y) as shown in FIG. 5, for example. An image sensor using the complementary color filter has however a problem in that CMYG is needed to be converted to RGB in consideration of seeing each image actually photographed by a human being, but noise occurs upon this conversion. Since, however, the complementary color filter has an advantage that it is good in sensitivity compared with the primary color filter, it is often used in an image sensor IS small in size (in other words, it can be said that the sensitivity is low).

Device Structure of Photodetecting Unit

Figure 6:
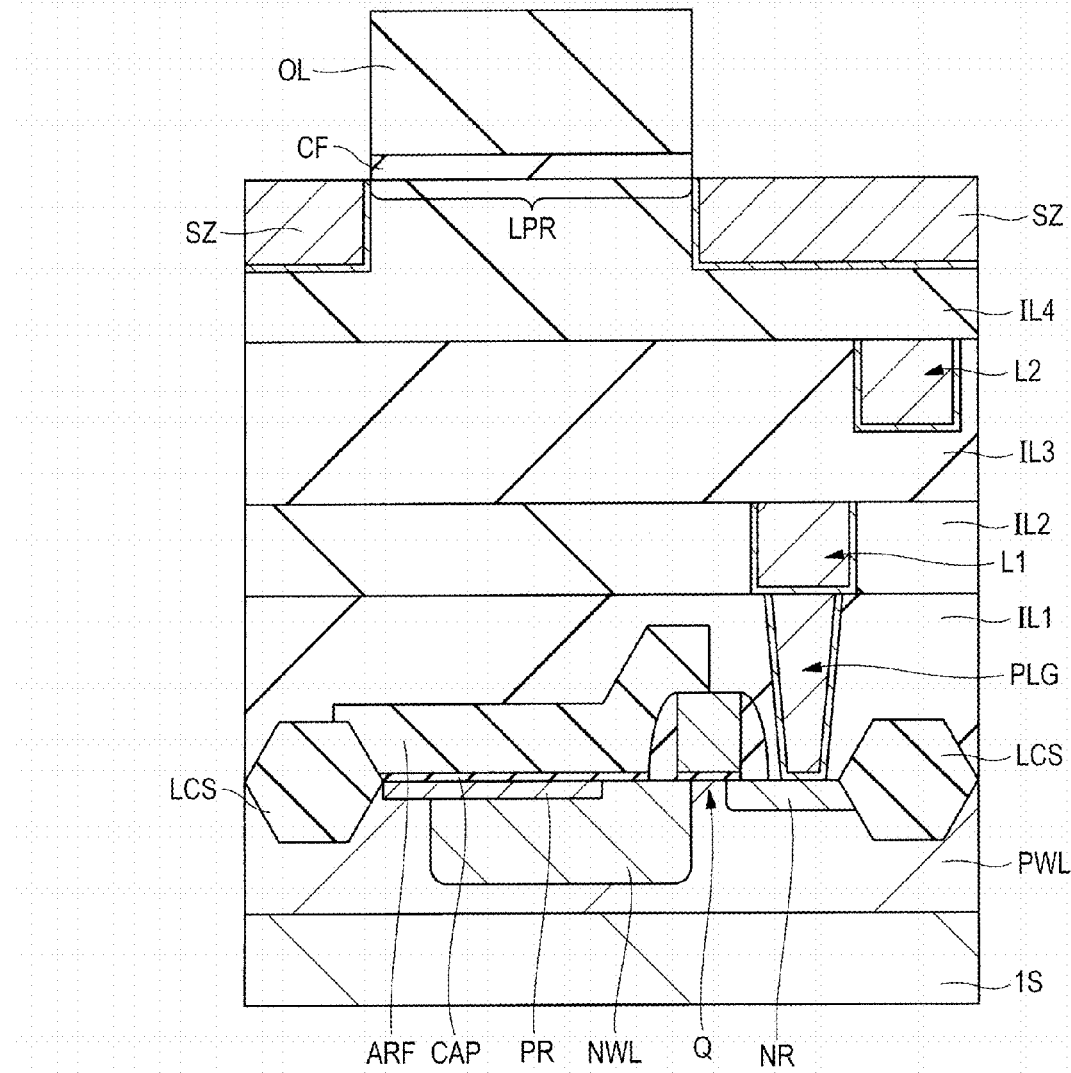
FIG. 6 is a cross-sectional diagram showing an example of a device structure of a photodetecting unit in an embodiment 1.

A device structure of a photodetecting unit of the image sensor will subsequently be described. FIG. 6 is a cross-sectional diagram showing an example of the device structure of the photodetecting unit. For example, a semiconductor substrate IS in which an n type impurity (donor) such as phosphorus (P), arsenic (As) or the like has been introduced is disposed in FIG. 6. An element isolation region LCS is formed in the surface (main surface, element forming surface) of the semiconductor substrate IS. An active region is partitioned by the element isolation region LCS, and the photodetecting unit is formed in the partitioned active region. Specifically, a p type well PWL with a p type impurity (acceptor) such as boron or the like introduced therein is formed in the semiconductor substrate IS. An n type well NWL with an n type impurity such as phosphorus (P), arsenic (As) or the like introduced therein is formed so as to be included in the p type well PWL. A photodiode (pn junction diode) is comprised of the p type well PWL (p type semiconductor region)

and the n type well NWL (n type semiconductor region). Further, a p+type semiconductor region PR is formed in part of the surface of the n type well NWL. The p+type semiconductor region PR is a region formed to suppress the generation of electrons based on interface levels formed in large numbers in the surface of the semiconductor substrate IS. That is, the electrons are generated in the surface region of the semiconductor substrate IS due to the influence of the interface levels even in a non-irradiated state of light, thereby causing an increase in dark current. Therefore, the p+type semiconductor region PR with positive holes as majority carriers is formed in the surface of the n type well NWL with electrons as majority carriers to thereby suppress the generation of the electrons in the non-irradiated state of light and suppress the increase in the dark current.

A gate insulating film is subsequently formed over the semiconductor substrate IS to overlap with part of the n type well NWL planarly. A gate electrode is formed over the gate insulating film. Then, sidewalls are formed over sidewalls on both sides of the gate electrode. For example, the gate insulating film is formed of a silicon oxide film, but not limited to it. The gate insulating film may be formed of a high dielectric constant film higher in permittivity than the silicon oxide film. For example, the gate insulating film may be formed of a hafnium-based insulating film in which lantern oxide has been introduced in hafnium oxide. Further, the gate electrode can be formed of, for example, a polysilicon film, and the sidewalls can be formed of, for example, a silicon oxide film, a silicon nitride film, or a laminated film of the silicon oxide film and the silicon nitride film.

Next, an n+type semiconductor region NR that serves as a drain region is formed within the semiconductor substrate IS provided in alignment with the gate electrode. The n+type semiconductor region NR is formed of a semiconductor region with an n type impurity such as phosphorus (P), arsenic (As) or the like introduced therein.

The photodiode and transfer transistor Q are formed over the semiconductor substrate IS in the above-described manner. Specifically, the photodiode is formed by the p type well PWL and the n type well NWL. Further, the transfer transistor Q is configured in such a manner that the above-described n type well NWL is taken as the source region and the n+type semiconductor region NR formed in the semiconductor region IS spaced by a predetermined distance from the n type well NWL is taken as the drain region. A region interposed between the source and drain region serves as a channel forming region. The gate electrode is formed over the channel forming region through the gate insulating film. Thus, the transfer transistor Q is formed which has the source region, the drain region, the channel forming region, the gate insulting film and the gate electrode. It is understood that the photodiode and the transfer transistor Q formed in the active region of the semiconductor substrate IS share the n type well NWL and are electrically coupled to each other.

Incidentally, a silicide film can also be formed in the surface of the drain region (n+type semiconductor region NR) of the transfer transistor Q. Thus, for example, the coupling resistance between the drain region and a plug PLG can be reduced. Incidentally, the silicide film can be formed of, for example, a nickel platinum silicide film, a nickel silicide film, a titanium silicide film, a cobalt silicide film or a platinum silicide film, etc.

A wiring structure formed in an upper layer of each of the photodiode and the transfer transistor Q formed over the semiconductor substrate IS will subsequently be described with reference to FIG. 6. In FIG. 6, a cap insulating film CAP is formed over the surface (the surfaces of the n type well NWL and p+type semiconductor region PR) of the photodiode. The cap insulating film CAP has a function to hold the surface characteristics (interface characteristics) of the semiconductor substrate IS satisfactorily and is formed of, for example, a silicon oxide film or a silicon nitride film. An antireflection film ARF is formed over the cap insulating film CAP and formed of, for example, a silicon oxynitride film.

Next, an interlayer insulating film IL1 is formed so as to cover the semiconductor substrate IS including the gate electrode and the above part of the antireflection film ARF. The plug PLG is formed which penetrates through the interlayer insulating film IL1 and reaches the n+type semiconductor region NR (drain region). The interlayer insulating film IL1 is formed of, for example, a silicon oxide film with TEOS (tetra ethyl ortho silicate) as a raw material. The plug PLG is formed by filling, for example, a barrier conductor film formed of a titanium film and a titanium nitride film (titanium film/titanium nitride film) formed over the titanium film, and a tungsten film formed over the barrier conductor film in a contact hole formed in the interlayer insulating film IL1.

Then, for example, an interlayer insulating film IL2 is formed over the interlayer insulating film IL1 formed with the plug PLG. A wiring L1 is formed in the interlayer insulating film IL2. For example, the interlayer insulating film IL2 is formed of, for example, a silicon oxide film, but not limited to it. The interlayer insulating film IL2 can also be formed of a low dielectric constant film lower in permittivity than the silicon oxide film. As the low dielectric constant film, there may be mentioned, for example, a SiOC film. The wiring L1 is formed of, for example, a copper wiring and can be formed by using the damascene method. Incidentally, the wiring L1 is not limited to the copper wiring, but can also be formed of an aluminum wiring. Subsequently, an interlayer insulating film IL3 comprised of, for example, a silicon oxide film or a low dielectric constant film is formed over the interlayer insulating film IL2 formed with the wiring L1. A wiring L2 is formed in the interlayer insulating film IL3. Further, an interlayer insulating film IL4 is formed over the interlayer insulating film IL3 formed with the wiring L2, and a light shielding zone SZ is formed in the interlayer insulating film IL4.

Here, the wirings L1 and L2 and the light shielding zone SZ are formed so as not to overlap with the photodiode planarly. A light penetration unit LPR is formed in a region that overlaps with the photodiode planarly. This is done to prevent the light incident to the photodiode from being shielded by the wirings L1 and L2 and the light shielding zone SZ. A microlens OL is mounted over the light penetration unit LPR through a color filter CF. Incidentally, the light shielding zone SZ is provided to separate the light incident to the photodiodes adjacent to each other from each other. That is, the light shielding zone SZ has the function of suppressing the entrance of leakage light between the adjacent photodetecting units.

The photodetecting unit is configured in the above-described manner. The operation thereof will hereinafter be described in brief. When light is made incident to the photodetecting unit in FIG. 6, the incident light first passes through the microlens OL and the color filter CF. Thereafter, the incident light passes through the light penetration unit LPR partitioned by the light shielding zone SZ and further passes through the interlayer insulating films IL4 to IL1 transparent to visible light, followed by entering the antireflection film ARF. The reflection of the incident light is suppressed in the antireflection film ARF, and hence the incident light having a sufficient quantity of light enters the photodiode. Since the energy of the incident light is larger than the bandgap in silicon in the photodiode, the incident light is absorbed by photoelectric conversion so that positive hole-electron pairs are generated. Electrons generated at this time are accumulated in the n type well NWL. The transfer transistor Q is turned on with a suitable timing. Specifically, a voltage greater than or equal to a threshold voltage is applied to the gate electrode of the transfer transistor Q. Then, a channel region (n type semiconductor region) is formed in the channel forming region placed directly below the gate insulating film. Thus, the source region (n type well NWL) of the transfer transistor Q and the drain region (n⁺type semiconductor region NR) thereof are electrically conducted to each other. As a result, the electrons accumulated in the n type well NWL reach the drain region through the channel region and are taken out from the drain region to an external circuit through a wiring layer. The photodetecting unit is operated in this manner.

Configuration (Summary) of Image Sensor

The image sensor configured in the above-described manner has a plurality of pixels respectively including photodiodes each functioning as a photoelectric conversion unit that converts incident light into an electric charge. The pixels are arranged in a matrix form in basic pattern units. The image sensor has optical members each arranged on the incidence side of the incident light than the pixels. The optical member has constituent elements respectively corresponding to the pixels.

Specifically, the pixels include a first wavelength range light pixel, which makes first wavelength range light included in the incident light enter therein, a second wavelength range light pixel, which is included in the incident light and makes second wavelength range light shorter in wavelength than the first wavelength range light enter therein, and a third wavelength range light pixel, which makes third wavelength range light shorter in wavelength than the second wavelength range light enter therein. If explained in an easy way to understand, for example, the "first wavelength range light" is red light, the "second wavelength range light" is green light, and the "third wavelength range light" is blue right. Further, the "first wavelength range light pixel" is a red pixel, the "second wavelength range light pixel" is a green pixel, and the "third wavelength range light pixel" is a blue pixel.

Each basic pattern that is a basic unit for a layout or arrangement pattern of plural pixels is comprised of an arrangement pattern in which the first wavelength range light pixel, the second wavelength range light pixel and the third wavelength range light pixel are combined. As the basic pattern, there maybe mentioned, for example, a Bayer array in which one red pixel, one blue pixel and two green pixels are combined. The basic pattern is not limited to the Bayer array, but may be comprised of various combination patterns each made up of a combination of red, blue and green pixels.

As one example of the optical members, there may be mentioned, for example, the light shielding zone SZ shown in FIG. 6. In this case, each constituent element corresponding to each of the pixels becomes the light penetration unit LPR partitioned by the light shielding zone SZ. In other words, the constituent element corresponding to each of the pixels is a light penetration unit LPR comprised of an opening provided in the light shielding zone SZ.

Further, as another example thereof, there may be mentioned, for example, the color filter CF shown in FIG. 1. In this case, of a plurality of constituent elements included in the optical member, the constituent element corresponding to the first wavelength range light pixel is a first wavelength range light penetration filter that transmits the first wavelength range light, the constituent element corresponding to the second wavelength range light pixel is a second wavelength range light penetration filter that transmits the second wavelength range light, and the constituent element corresponding to the third wavelength range light pixel is a third wavelength range light penetration filter that transmits the third wavelength range light. In plain words, for example, of the constituent elements included in the optical member, the constituent element corresponding to the red pixel is a red filter that transmits the red light, the constituent element corresponding to the green pixel is a green filter that transmits the green light, and the constituent element corresponding to the blue pixel is a blue filter that transmits the blue light.

Furthermore, as a further example thereof, there may be mentioned, for example, a microlens group shown in FIG. 1. In this case, each constituent element corresponding to each of a plurality of pixels is a microlens OL. As described above, the "optical member" described in the present specification is used as a concept including at least the light shielding zone SZ, color filter CF and microlens group provided in the image sensor.

Positional Relation Between Photoelectric Conversion Unit and Constituent Elements of Optical Member As described above, the plural pixels that configure the pixel array exist in the image sensor. Each photodiode that functions as the photoelectric conversion unit is formed in each of the pixels. Then, each constituent element of the optical member is arranged on the incidence side of the incident light to the photodiode with respect to each of the pixels.

Here, the image sensor is configured in such a manner that as shown in FIG. 1 by way of example, an image formed by focusing the incident light by the lens L that functions as an image forming lens is imaged or obtained by the image sensor IS. Accordingly, since the incident light passes through the lens L, the incidence direction of the incident light incident to each pixel changes depending on the arrangement position of each pixel arranged in the photodetecting surface of the image sensor IS.

Figure 7:
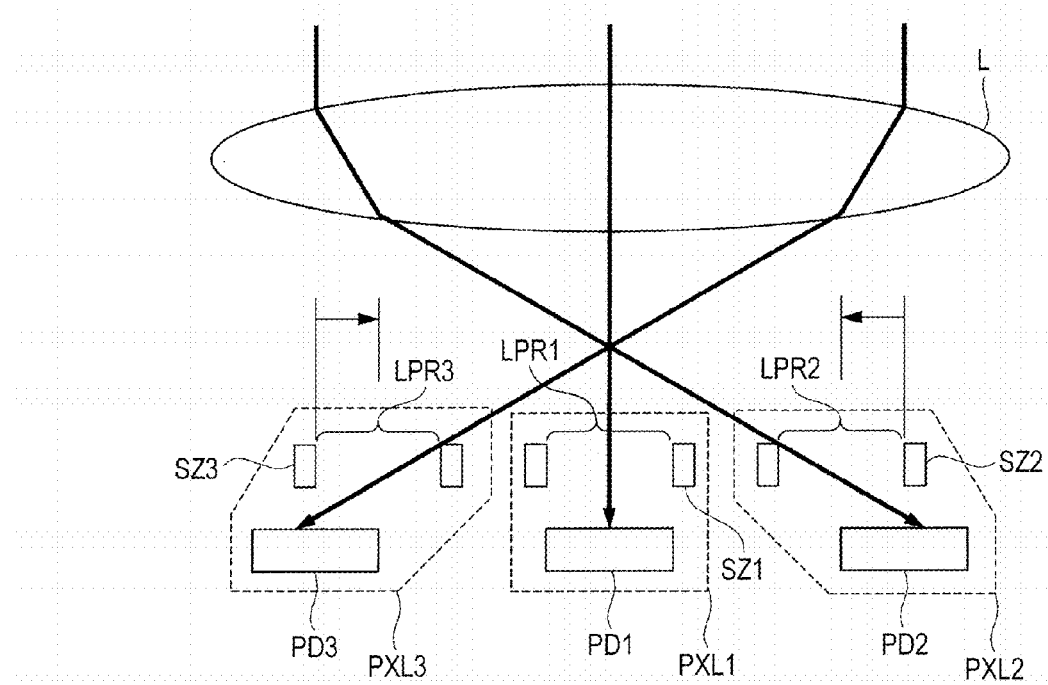
FIG. 7 is a diagram typically illustrating the manner of light incident on a plurality of pixels.

Specifically, FIG. 7 is a diagram typically showing the manner of incident light incident onto a plurality of pixels. Of the pixels that configure a pixel array, there are illustrated in FIG. 7, for example, a pixel PXL1 arranged in the center with respect to the lens L, a pixel PXL2 arranged in a right peripheral portion with respect to the lens L, and a pixel PXL3 arranged in a left peripheral portion with respect to the lens L.

Since the incident light passes through the central part of the lens L in the pixel PXL1 in FIG. 7, the incident light linearly advances without refraction by the lens L. As a result, the straight advancing incident light is made incident to the pixel PXL1. Thus, as shown in FIG. 7, the arrangement position of a photodiode PD1 formed in the pixel PXL1 and the arrangement position of a light penetration unit LPR1 formed in a light shielding zone SZ1 are required to be aligned to make the incident light incident to the photodiode PD1 efficiently.

On the other hand, in FIG. 7, since the incident light is refracted by the lens L in the pixel PXL2 because the incident light passes through the peripheral portion of the lens L. As a result, the light refracted by the lens L is made incident to the pixel PXL2 from a diagonal or oblique direction. Therefore, in the pixel PXL2, the incident light made incident from the diagonal direction is shielded by a light shielding zone SZ2 when the arrangement position of a photodiode PD2 formed in the pixel PXL2 and the arrangement position of a light penetration unit LPR2 formed in the light shielding zone SZ2 are aligned with each other. There is thus a fear that the quantity of the incident light made incident to the pixel PXL2 is reduced so that photosensitivity is deteriorated. From this point of view, as shown in FIG. 7, in order to make the incident light incident to the photodiode PD2 efficiently, the arrangement position of the light penetration unit LPR2 formed in the light shielding zone SZ2 is shifted to the center side of the pixel array with respect to the arrangement position of the photodiode PD2 formed in the pixel PXL2.

Similarly, in FIG. 7, since the incident light is refracted by the lens L in the pixel PXL3 because the incident light passes through the peripheral portion of the lens L. As a result, the light refracted by the lens L is made incident to the pixel PXL3 from a diagonal direction. Therefore, in the pixel PXL3, the incident light made incident from the diagonal direction is shielded by a light shielding zone SZ3 when the arrangement position of a photodiode PD3 formed in the pixel PXL3 and the arrangement position of a light penetration unit LPR3 formed in the light shielding zone SZ3 are aligned with each other. There is thus a fear that the quantity of the incident light made incident to the pixel PXL3 is reduced so that photosensitivity is deteriorated. From this point of view, as shown in FIG. 7, in order to make the incident light incident to the photodiode PD3 efficiently, the arrangement position of the light penetration unit LPR3 formed in the light shielding zone SZ3 is shifted to the center side of the pixel array with respect to the arrangement position of the photodiode PD3 formed in the pixel PXL3.

Thus, in the image sensor, the incident light is made obliquely incident to the photodiode in each pixel arranged in the peripheral portion of the pixel array. Accordingly, in terms of making the incident light incident to the photodiode efficiently, in the image sensor, the arrangement position of each light penetration unit formed in the light shielding zone is shifted to the center side of the pixel array with respect to the arrangement position of the photodiode formed in the pixel arranged in the peripheral portion of the pixel array.

The present embodiment has described the example in which the "light shielding zone" has been taken up as the optical member, and the "light penetration unit" has been taken up as the constituent element of the optical member, but not limited to it. Similarly, this can also be said about an optical member (each constituent element thereof) arranged on the incidence side of the incident light to the photodiode. For example, the "red filter", "green filter" and "blue filter" (constituent elements of optical member) that configure the "color filter" being the optical member are preferably arranged with being shifted to the center side of the pixel array with respect to the arrangement position of the photodiode formed in each pixel arranged in the peripheral portion of the pixel array in terms of making the incident light incident to the photodiode efficiently. Further, for example, each of the "microlenses" (constituent elements of optical member) that configure the "microlens group" being the optical member is also preferably arranged with being shifted to the center side of the pixel array with respect to the arrangement position of each photodiode formed in the pixel arranged in the peripheral portion of the pixel array in terms of making the incident light incident to the photodiode efficiently.

In the way described above, in the image sensor, the arrangement position of each constituent element of the optical member, corresponding to each pixel arranged in the peripheral portion of the pixel array in the pixels configuring the pixel array is arranged with being shifted to the center side of the pixel array with respect to the arrangement position of the photodiode. Thus, since it is possible to suppress a reduction in the quantity of the incident light made incident to the photodiode from the oblique direction even in each pixel arranged in the peripheral portion of the pixel array, the photosensitivity of the image sensor can be improved.

Description of Related Art

A description will first be described below about a related art related to the image sensor. Thereafter, a description will be made about room for improvement that exists in the related art. A description will thereafter be made about a technical idea in the present embodiment 1 in which a contrivance has been applied to the room for improvement existing in the related art.

Figure 8:
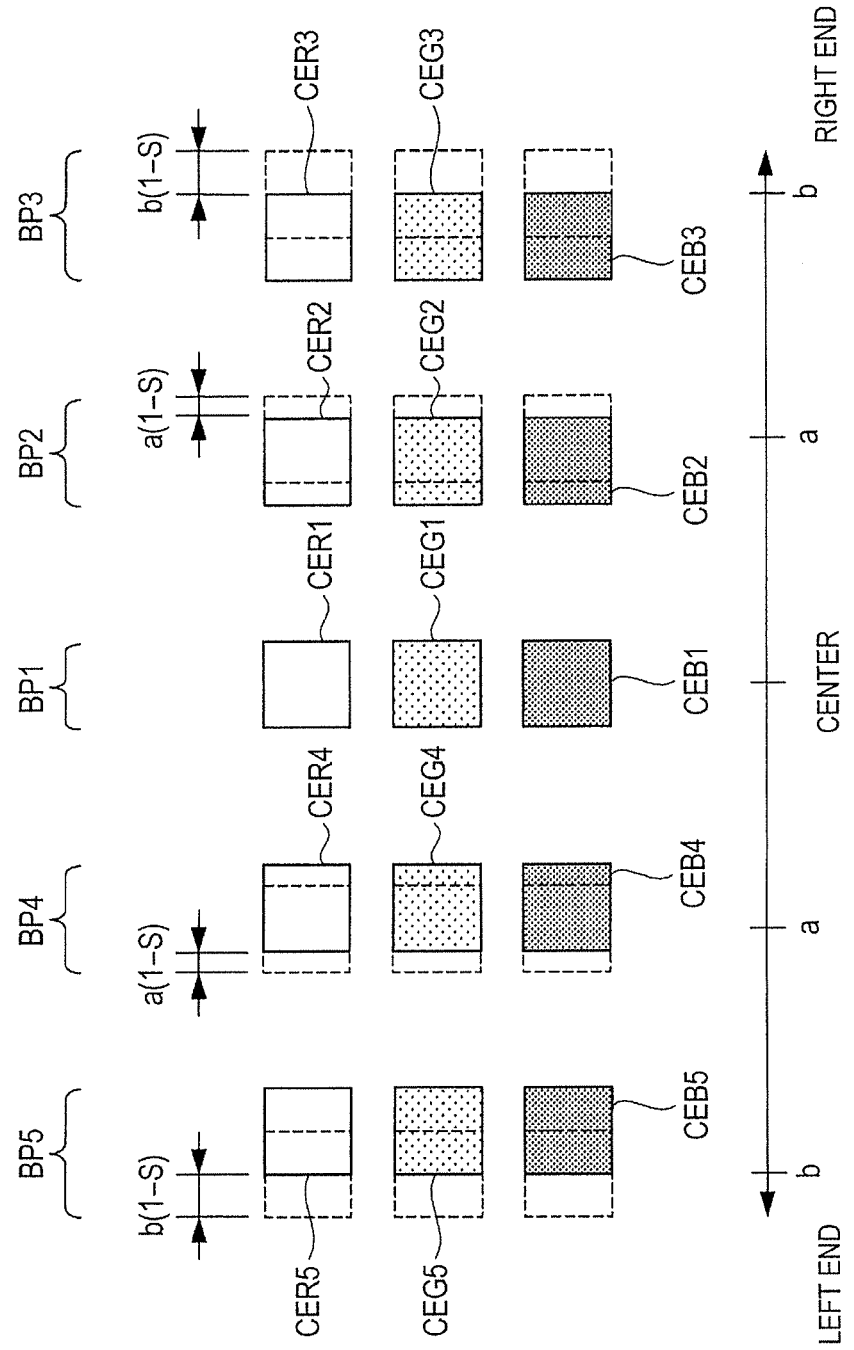
FIG. 8 is a typical diagram for describing the arrangement of constituent elements of each optical member included in an image sensor in a related art.

FIG. 8 is a typical diagram for describing the arrangement of constituent elements of an optical member included in the image sensor in the related art. The arrangement positions of the constituent elements of the optical member, corresponding to a plurality of pixels that configure a pixel array are typically shown in FIG. 8. Specifically, it is assumed even in the related art that a plurality of pixels configuring a pixel array are arranged in basic pattern units each comprised of a Bayer array. Even in the related art, since the constituent elements of the optical member exist in association with the pixels respectively, the constituent elements of the optical member are arranged in association with the basic pattern with the pixels arranged therein. In FIG. 8, however, basic patterns BP1 through BP5 each comprised of a Bayer array are shown in a simplified simple array to clearly explain a technology related to the related art.

In FIG. 8, the constituent elements (which means constituent elements of an optical member when hereinafter simply called components or constituent elements) of the optical member, which are included in each of the five basic patterns BP1 through BP5, are illustrated in FIG. 8. Specifically, the basic pattern BP1 indicates a basic pattern located in the center of the pixel array. A constituent element CER1 corresponding to a red pixel, a constituent element CEG1 corresponding to a green pixel, and a constituent element CEB1 corresponding to a blue pixel are included within the basic pattern BP1.

Also in FIG. 8, the basic pattern BP2 indicates a basic pattern located at a place separated by a distance a to the right side from the center of the pixel array. A constituent element CER2 corresponding to the red pixel, a constituent element CEG2 corresponding to the green pixel, and a constituent element CEB2 corresponding to the blue pixel are included within the basic pattern BP2.

Further, in FIG. 8, the basic pattern BP3 indicates a basic pattern located at a place separated by a distance b (b>a) to the right side from the center of the pixel array. A constituent element CER3 corresponding to the red pixel, a constituent element CEG3 corresponding to the green pixel, and a constituent element CEB3 corresponding to the blue pixel are included within the basic pattern BP3.

On the other hand, in FIG. 8, the basic pattern BP4 indicates a basic pattern located at a place separated by the distance a to the left side from the center of the pixel array. A constituent element CER4 corresponding to the red pixel, a constituent element CEG4 corresponding to the green pixel, and a constituent element CEB4 corresponding to the blue pixel are included within the basic pattern BP4.

Further, in FIG. 8, the basic pattern BP5 indicates a basic pattern located at a place separated by the distance b (b>a) to the left side from the center of the pixel array. A constituent element CER5 corresponding to the red pixel, a constituent element CEG5 corresponding to the green pixel, and a constituent element CEB5 corresponding to the blue pixel are included within the basic pattern BP5.

Here, in the related art, the arrangement position of each constituting element of the optical member, corresponding to each pixel arranged in the peripheral portion of the pixel array, of the pixels that configure the pixel array is arranged with being shifted to the center side of the pixel array with respect to the arrangement position of the photodiode.

Specifically, in the related art, in the basic patterns BP2 and BP4 as shown in FIG. 8, the constituent elements CER2, CEG2 and CEB2 and the constituent elements CER4, CEG4 and CEB4 are respectively arranged with being shifted to the center side of the pixel array by a misregistration amount indicated by "a (1-S)" with respect to the distance a being the arrangement distance from the center of the pixel array. At this time, "S" is a constant value indicative of a shrink rate. Incidentally, in the present specification, the constituent elements in each of which misregistration occurs may be called misregistration constituent elements. Thus, for example, the constituent elements CER2, CEG2 and CEB2 and the constituent elements CER4, CEG4 and CEB4 can be called misregistration constituent elements.

Similarly, in the related art, in the basic patterns BP3 and BP5 as shown in FIG. 8, the constituent elements CER3, CEG3 and CEB3 and the constituent elements CER5, CEG5 and CEB5 are respectively arranged with being shifted to the center side of the pixel array by a misregistration amount indicated by "b (1-S)" with respect to the distance b being the arrangement distance from the center of the pixel array. Even in this case, for example, the constituent elements CER3, CEG3 and CEB3 and the constituent elements CER5, CEG5 and CEB5 become misregistration constituent elements.

Thus, in the related art, the misregistration constituent elements in each of which misregistration occurs with respect to each photodiode that functions as the photoelectric conversion unit exist in the constituent elements that configure the optical member. In the misregistration constituent elements as shown in FIG. 8, the misregistration amount increases toward the misregistration constituent elements away from the center position of the pixel array.

According to the image sensor in the related art configured in this way, a reduction in the quantity of the incident light made incident to the photodiode from the oblique direction can be suppressed even at each pixel arranged in the peripheral portion of the pixel array, and hence the photosensitivity of the image sensor can be improved. In particular, as each pixel is subjected to being arranged in the peripheral portion of the pixel array, the incident light is made incident to the photodiode from the oblique direction (direction in which it approaches the horizontal direction) at large angle of incidence. For this reason, as in the related art, it is considered that the reduction in the quantity of the incident light made incident to the photodiode from the oblique direction can effectively be suppressed by increasing the amount of misregistration toward each of the misregistration constituent elements away from the center position of the pixel array.

Incidentally, the "incident angle" is defined as an incident angle of incident light measured from the normal line erected on the surface of each pixel. For example, when incident light is made incident from the direction orthogonal to a pixel, the "incident angle" becomes 0 degrees.

Room for Improvement Existing in the Related Art

As a result of examining the above-described related art by the present inventors, it became clear that room for improvement to be shown below existed in the related art. This room for improvement will be described.

For example, as shown in FIG. 7, the incident light from a subject enters the lens L that functions as the image forming lens, but the incident light made incident to the peripheral portion of the lens L is refracted by the lens L. Since, at this time, the incident light includes light of various wavelengths, and wavelength dependence exists in the index of refraction, the magnitude of refraction varies depending on the light different in wavelength. That is, a chromatic aberration occurs in the incident light made incident to the lens L. Specifically, since the refraction index becomes large as the wavelength becomes short, for example, the magnitude of the refraction index of blue light short in wavelength becomes larger than the magnitude of the refraction index of red light long in wavelength.

Here, in the above-described related art, the configuration shown below has been adopted in each pixel arranged in the peripheral portion of the pixel array in terms of making the incident light incident to each photodiode efficiently, taking into consideration that the incident light is made incident to the photodiode from the oblique direction. That is, in the related art, as shown in FIG. 8, the arrangement position of each constituent element of the optical member, corresponding to each pixel arranged in the peripheral portion of the pixel array, of the pixels that configure the pixel array is arranged with being shifted to the center side of the pixel array with respect to the arrangement position of the photodiode.

When the reference is however made to the basic pattern BP2, for example, the amount of misregistration of the constituent element CER2 corresponding to the red pixel, the amount of misregistration of the constituent element CEG2 corresponding to the green pixel, and the amount of misregistration of the constituent element CEB2 corresponding to the blue pixel become the same amount of misregistration in the related art. That is, in the related art, for example, the amount of misregistration of each constituent element is determined without considering the chromatic aberration that the magnitude of refraction of the blue light short in wavelength becomes larger than that of refraction of the red light long in wavelength.

For this reason, it becomes difficult for the related art to obtain the maximum sensitivity by causing the incident light to enter efficiently in the red, green and blue pixels even if the constituent elements of the optical member are arranged with being shifted with respect to the photodiode formed in each pixel. Described specifically, in the related art, the arrangement position of each constituent element is shifted with the amount of misregistration common to each of the red, green and blue pixels included within the same basic pattern. Therefore, for example, even if the above common amount of misregistration is set such that the maximum sensitivity is obtained with respect to the red pixel, it is not possible for the green and blue pixels to cause the incident light to enter efficiently because of the chromatic aberration that the magnitude of refraction varies with respect to light different in wavelength. As a result, it is not possible to obtain the maximum sensitivity with respect to the green and blue pixels. That is, since no chromatic aberration is taken into consideration in the related art, it becomes difficult to obtain the maximum sensitivity in the red, green and blue pixels simultaneously. In other words, in the related art, there exists room for improvement for the red, green and blue pixels in terms of obtaining the maximum sensitivity simultaneously.

Feature of Embodiment 1

Thus, in the present embodiment 1, contrivances are done with respect to the room for improvement that exists in the above-described related art. A description will be made about the technical idea in the present embodiment 1 in which the contrivances are done.

Figure 9:
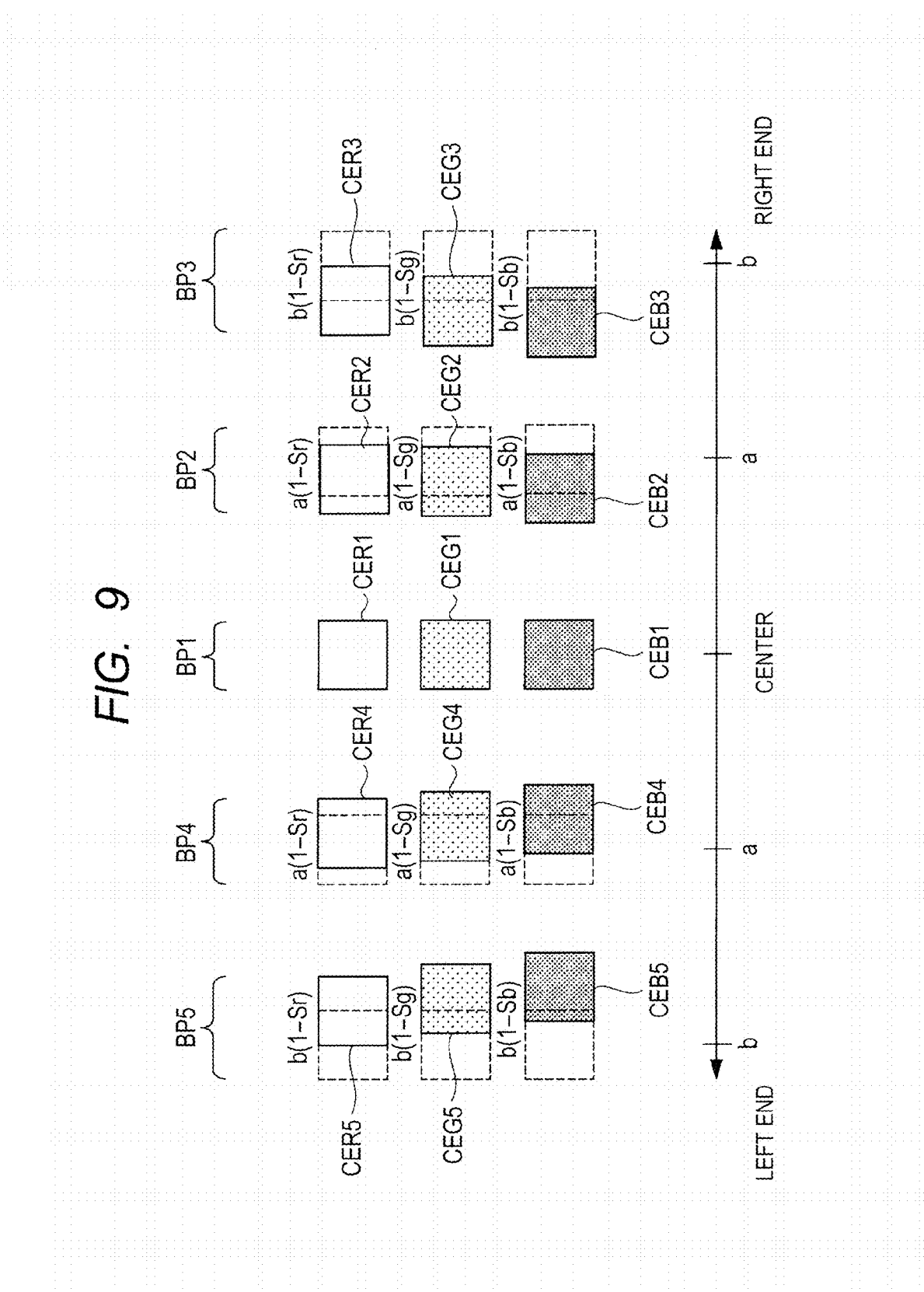
FIG. 9 is a typical diagram for describing the arrangement of constituent elements of each optical member included in an image sensor in the embodiment 1.

FIG. 9 is a typical diagram for describing the arrangement of the constituent elements of each optical member included in the image sensor in the present embodiment 1. There are typically shown in FIG. 9 the positions of arrangement of the constituent elements of the optical members corresponding to a plurality of pixels that configure a pixel array. Specifically, even in the present embodiment 1, a plurality of pixels that configure a pixel array are assumed to be arranged in basic pattern units each comprised of a Bayer array. Further, even in the present embodiment 1, since the constituent elements of the optical members exist in association with the pixels respectively, the constituent elements of the optical members are arranged in association with the basic patterns with the pixels arranged therein. In FIG. 9, however, basis patterns BP1 through BP5 each comprised of a Bayer array are shown in a simplified simple array to clearly explain the technical idea in the present embodiment 1.

The constituent elements of the optical member, which are included in each of the five basic patterns BP1 to BP5, are illustrated in FIG. 9. Specifically, the basic pattern BP1 indicates a basic pattern located in the center of the pixel array. A constituent element CER1 corresponding to a red pixel, a constituent element CEG1 corresponding to a green pixel, and a constituent element CEB1 corresponding to a blue pixel are included within the basic pattern BP1.

Also in FIG. 9, the basic pattern BP2 indicates a basic pattern located at a place separated by a distance a to the right side from the center of the pixel array. A constituent element CER2 corresponding to the red pixel, a constituent element CEG2 corresponding to the green pixel, and a constituent element CEB2 corresponding to the blue pixel are included within the basic pattern BP2.

Further, in FIG. 9, the basic pattern BP3 indicates a basic pattern located at a place separated by a distance b (b>a) to the right side from the center of the pixel array. A constituent element CER3 corresponding to the red pixel, a constituent element CEG3 corresponding to the green pixel, and a constituent element CEB3 corresponding to the blue pixel are included within the basic pattern BP3.

On the other hand, in FIG. 9, the basic pattern BP4 indicates a basic pattern located at a place separated by the distance a to the left side from the center of the pixel array. A constituent element CER4 corresponding to the red pixel, a constituent element CEG4 corresponding to the green pixel, and a constituent element CEB4 corresponding to the blue pixel are included within the basic pattern BP4.

Further, in FIG. 9, the basic pattern BP5 indicates a basic pattern located at a place separated by the distance b (b>a) to the left side from the center of the pixel array. A constituent element CER5 corresponding to the red pixel, a constituent element CEG5 corresponding to the green pixel, and a constituent element CEB5 corresponding to the blue pixel are included within the basic pattern BP5.

Here, in the present embodiment 1, the arrangement position of each constituting element of the optical member, corresponding to each pixel arranged in the peripheral portion of the pixel array, of the pixels that configure the pixel array is arranged with being shifted to the center side of the pixel array with respect to the arrangement position of the photodiode.

Specifically, in the present embodiment 1, in the basic patterns BP2 and BP4 as shown in FIG. 9, the constituent elements CER2 and CER4 are respectively arranged with being shifted to the center side of the pixel array by a misregistration amount indicated by "a (1-Sr)" with respect to the distance a being the arrangement distance from the center of the pixel array. Also, in the present embodiment 1, in the basic patterns BP2 and BP4, the constituent elements CEG2 and CEG4 are respectively arranged with being shifted to the center side of the pixel array by a misregistration amount indicated by "a (1-Sg)" with respect to the distance a being the arrangement distance from the center of the pixel array. Further, in the present embodiment 1, in the basic patterns BP2 and BP4, the constituent elements CEB2 and CEB4 are respectively arranged with being shifted to the center side of the pixel array by a misregistration amount indicated by "a (1-Sb)" with respect to the distance a being the arrangement distance from the center of the pixel array. At this time, "Sr" indicates a shrink rate of the constituent element corresponding to the red pixel, "Sg" indicates a shrink rate of the constituent element corresponding to the green pixel, and "Sb" indicates a shrink rate of the constituent element corresponding to the blue pixel. Further, "Sr", "Sg" and "Sb" are different in value. "Sr" is larger in value than "Sg", and "Sb" is smaller in value than "Sg" (Sr>Sg>Sb).

Similarly, in the present embodiment 1, in the basic patterns BP3 and BP5 as shown in FIG. 9, the constituent elements CER3 and CER5 are respectively arranged with being shifted to the center side of the pixel array by a misregistration amount indicated by "b (1-Sr)" with respect to a distance b (b>a) being an arrangement distance from the center of the pixel array. Also, in the present embodiment 1, the constituent elements CEG3 and CEG5 are respectively arranged with being shifted to the center side of the pixel array by a misregistration amount indicated by "b (1-Sg)" with respect to the distance b being the arrangement distance from the center of the pixel array. Further, in the present embodiment 1, in the basic patterns BP3 and BP5, the constituent elements CEB3 and CEB5 are respectively arranged with being shifted to the center side of the pixel array by a misregistration amount indicated by "b (1-Sb)" with respect to the distance b being the arrangement distance from the center of the pixel array.

Thus, even in the present embodiment 1, the misregistration constituent elements in each of which misregistration occurs with respect to each photodiode that functions as the photoelectric conversion unit exist in the constituent elements that configure each optical member. In the misregistration constituent elements as shown in FIG. 9, the misregistration amount increases toward the misregistration constituent elements away from the center position of the pixel array. Thus, according to the image sensor in the present embodiment 1, a reduction in the quantity of the incident light made incident to the photodiode from the oblique direction can be suppressed even at each pixel arranged in the peripheral portion of the pixel array. Therefore, according to the present embodiment 1, the photosensitivity of the image sensor can be improved.

In particular, as each pixel is subjected to being arranged in the peripheral portion of the pixel array, the incident light is made incident to the photodiode from the oblique direction (direction in which it approaches the horizontal direction) at a large angle of incidence. For this reason, as in the present embodiment 1, the reduction in the quantity of the incident light made incident to the photodiode from the oblique direction can effectively be suppressed by increasing the amount of misregistration toward each of the misregistration constituent elements away from the center position of the pixel array.

Further, a feature point peculiar to the present embodiment 1 resides in the configuration in each arbitrary basic pattern comprised of the pixels corresponding to the misregistration constituent elements as shown in FIG. 9, for example. That is, the feature point peculiar to the present embodiment 1 resides in that the amount of misregistration of each misregistration constituent element corresponding to the first wavelength range light pixel is smaller than the amount of misregistration of each misregistration constituent element corresponding to the second wavelength range light pixel, and the amount of misregistration of each misregistration constituent element corresponding to the third wavelength range light pixel is larger than the amount of misregistration of each misregistration constituent element corresponding to the second wavelength range light pixel.

If explained in an easy way to understand, the feature of the present embodiment 1 resides in that in the basic pattern BP2 of FIG. 9, for example, the amount of misregistration of the constituent element CER2 corresponding to the red pixel is smaller than the amount of misregistration of the constituent element CEG2 corresponding to the green pixel, and the amount of misregistration of the constituent element CEB2 corresponding to the blue pixel is larger than the amount of misregistration of the constituent element CEG2 corresponding to the green pixel. That is, in the present embodiment 1, for example, the misregistration amounts of the constituent elements CER2, CEG2 and CEB2 are determined in consideration of a chromatic aberration of incident light in the constituent elements CER2, CEG2 and CEB2 included in the same basic pattern BP2.

Specifically, in the present embodiment 1, in association with the chromatic aberrations that the magnitude of refraction of the red light is larger than that of refraction of the green light, and the magnitude of refraction of the blue light is larger than that of refraction of the green light, the amount of misregistration of the constituent element CER2 is smaller than the amount of misregistration of the constituent element CEG2, and the amount of misregistration of the constituent element CEB2 is larger than the amount of misregistration of the constituent element CEG2. Thus, according to the present embodiment 1, even when the chromatic aberrations exist, the misregistration amounts of the constituent elements corresponding to the respective red, green and blue pixels existing in the same basic pattern are optimized in consideration of the chromatic aberrations. Therefore, according to the present embodiment 1, the maximum sensitivity can be obtained at the red, green and blue pixels simultaneously, whereby the photosensitivity of the image sensor in the present embodiment 1 can be improved.

Thus, in the technical idea in the present embodiment 1, the misregistration amounts of the constituent elements of the optical member, which respectively correspond to the red, green and blue pixels existing in the same basic pattern, are made different in correspondence with the chromatic aberration that the magnitude of refraction varies depending on the wavelength. That is, the optimum values of the misregistration amounts of the constituent elements of the optical member, which respectively correspond to the red, green and blue pixels, differ according to the chromatic aberration. Therefore, the misregistration amounts of the constituent elements of the optical member, which respectively correspond to the red, green and blue pixels, are determined in consideration of this point. The feature point of the technical idea in the present embodiment 1 resides in it. According to the present embodiment 1, a reduction in the quantity of light incident to each of the red, green and blue pixels can be suppressed by the feature point, so that it is possible to enhance sensitivity at the red, green and blue pixels simultaneously.

Embodiment 2

The present embodiment 2 will describe a technical idea to generate layout data for realizing the layout arrangement of each constituent element described in the embodiment 1.

First, the need for a layout data generating device that generates the layout data of the constituent elements described in the embodiment 1 will be described in the present embodiment 2.

Need for Layout Data Generating Device

A photolithography technology using a mask is used in, for example, constituent elements of an optical member typified by a light shielding zone, a color filter or a microlens group. Accordingly, a mask is needed to form the constituent elements of each optical member. Layout data indicative of the position of arrangement of each constituent element of the optical member is required to form the mask.

Here, layout data indicative of respective initial arrangement positions of a plurality of constituent elements arranged in the same positions as those of a plurality of photoelectric conversion units (photodiodes) in plan view are defined as initial layout data. Further, layout data to which adjustments corresponding to misregistration constituent elements have been reflected are defined as corrected layout data.

For example, when the misregistration constituent elements are not included in a plurality of constituent elements, the mask is formed by using the initial layout data. In this case, the initial layout data of the constituent elements are presented from a device maker to a mask maker, so that the mask maker forms a mask on the basis of the presented initial layout data. Then, in the device maker, the constituent elements of each optical member are formed by using the mask produced based on the initial layout data.

When reference is made to the above related art in this regard, the misregistration constituent elements exist even in the related art. There is therefore a need to perform adjustments corresponding to the misregistration constituent elements from the initial layout data with respect to the layout data used in the related art. The device maker does not however generate corrected layout data with adjustments corresponding to the misregistration constituent elements being reflected thereto. Even in this case, the current state is that the initial layout data of each constituent element has been presented from the device maker to the mask maker. In this case, an adjustment instruction from the device maker is transferred to the mask maker, whereby the mask maker performs adjustments corresponding to the misregistration constituent elements from the initial layout data to manufacture a mask.

Figure 10:
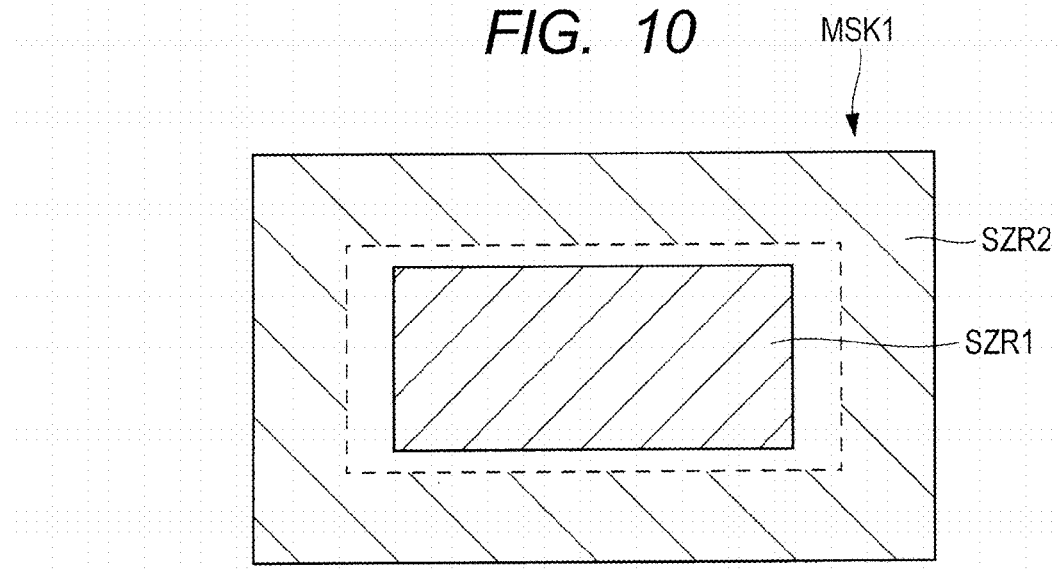
FIG. 10 is a typical diagram illustrating an example in which an adjustment corresponding to a misregistration constituent element is done from initial layout data of a light shielding zone to form a mask in a mask maker.

A description will be made below by taking up a light shielding zone as an optical member. FIG. 10 is a typical diagram illustrating an example in which an adjustment corresponding to each misregistration constituent element is done from initial layout data of a light shielding zone to form a mask MSK1 in the mask maker. As shown in FIG. 10, a light shielding zone region SZR1 and a light shielding zone region SZR2 are formed in the mask MSK1. For example, the light shielding zone region SZR1 is a light shielding zone region corresponding to a pixel region in which a plurality of pixels are formed, and the light shielding zone region SZR2 is a light shielding zone region corresponding to a peripheral circuit region in which a peripheral circuit such as a logic circuit, an AD conversion circuit or the like is formed.

In the related art, as an example in which the adjustment corresponding to each misregistration constituent element is done from the initial layout data of the light shielding zone, an adjustment to shrink the light shielding zone region SZR1 is carried out by the mask maker as shown in FIG. 10, for example. In this case, the mask maker performs electron beam drawing with division into the light shielding zone region SZR1 corresponding to the pixel region and the light shielding zone region SZR2 corresponding to the peripheral circuit region to thereby manufacture the mask MSK1. There is therefore a possibility that in the mask MSK1, a drawing misalignment due to the electron beam drawing will occur between the light shielding zone region SZR1 and the light shielding zone region SZR2.

Figure 11:
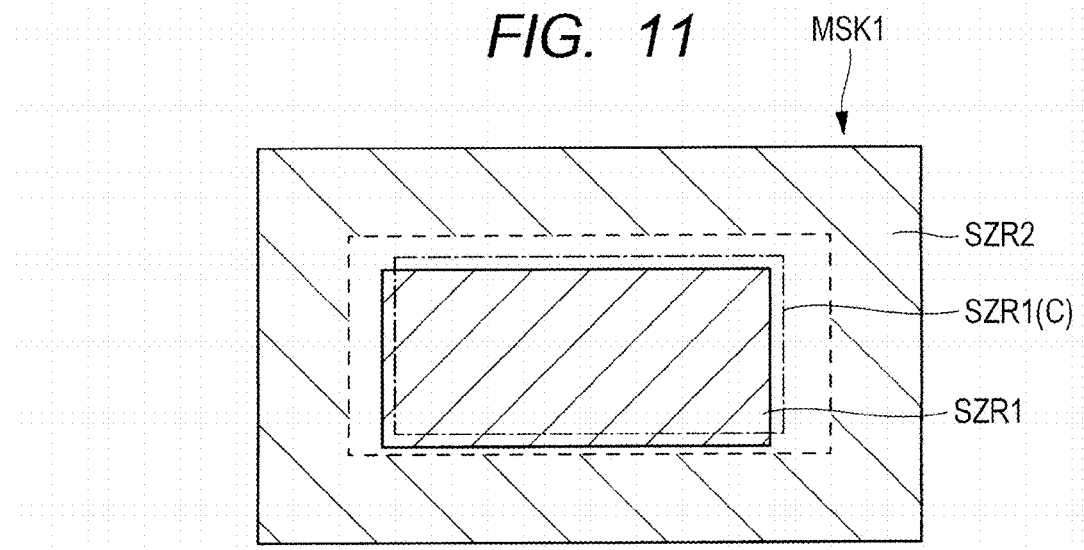
FIG. 11 is a typical diagram showing a state in which drawing misalignment due to electron beam drawing have occurred between a plurality of light shielding zone regions.

FIG. 11 is a typical diagram showing a state in which a drawing misregistration due to electron beam drawing has occurred between the light shielding zone regions SZR1 and SZR2. It is understood that in FIG. 11, a light shielding zone region SZR1 (C) originally indicates a region in which the light shielding zone region SZR1 is formed, but in fact, as shown in FIG. 11, the light shielding zone region SZR1 is formed shifted from the light shielding zone region SZR1 (C) by the drawing misalignment due to the electron beam drawing. In this case, the adjustment to shrink the light shielding zone region SZR1 is not sufficiently reflected to the mask MSK1.

Figure 12:
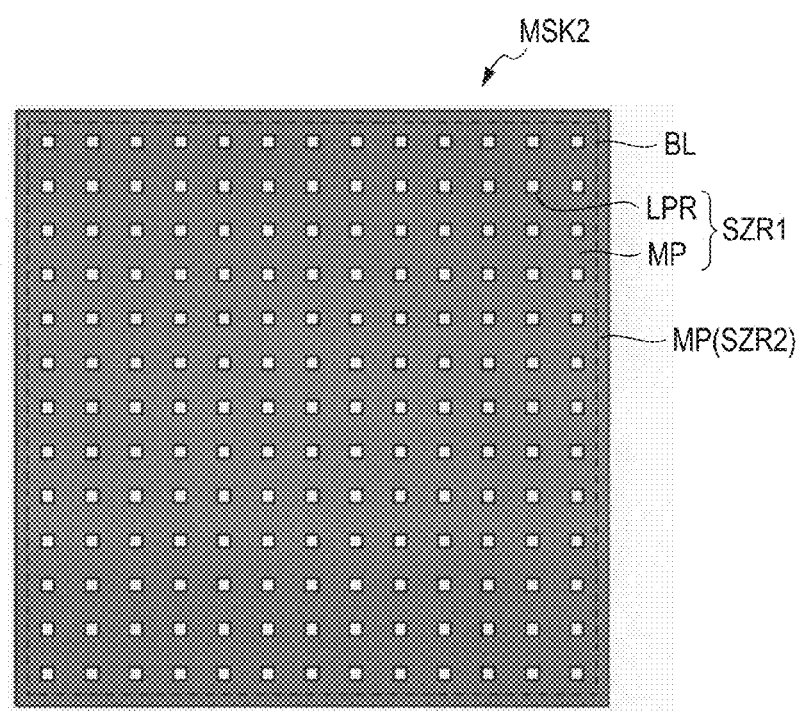
FIG. 12 is a typical diagram depicting an example of a mask in which a light shielding zone region corresponding to a pixel region is formed of a metal pattern and light penetration units and a light shielding zone region corresponding to a peripheral circuit region is formed of a metal pattern.
Figure 13:
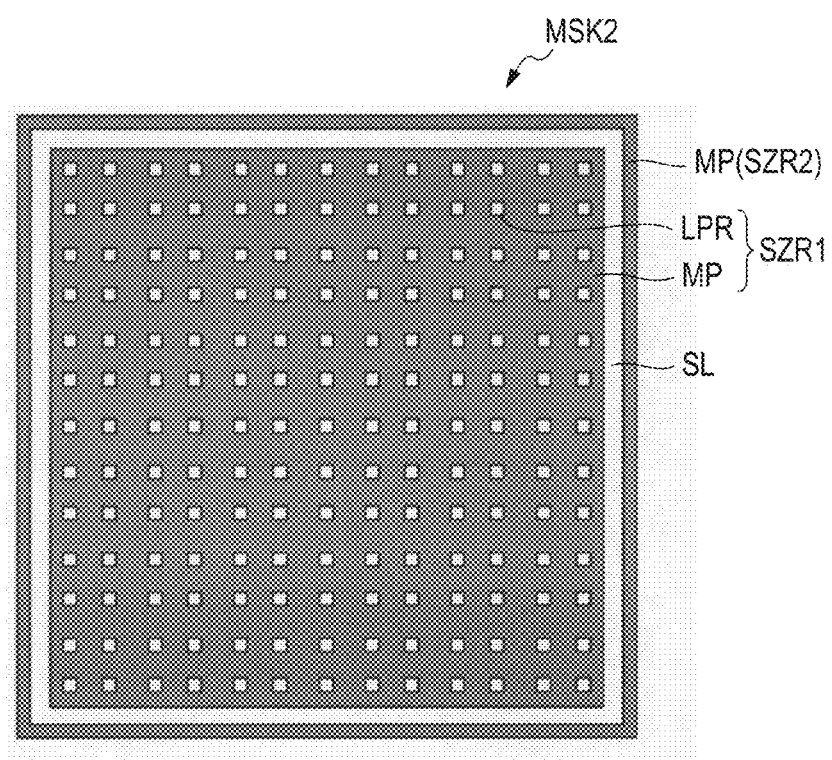
FIG. 13 is a diagram showing a state in which a slit is formed.

Further, FIG. 12 is a typical diagram showing an example of a mask MSK2 in which a light shielding zone region SZR1 corresponding to a pixel region is formed of a metal pattern MP and light penetration units LPR, and a light shielding zone region SZR2 corresponding to a peripheral circuit region is formed of a metal pattern MP. In FIG. 12, a boundary line BL is shown between the light shielding zone region SZR1 and the light shielding zone region SZR2. Consider where an adjustment to shrink the light shielding zone region SZR1 existing inside the boundary line BL by the mask maker is done with the boundary line BL as a boundary. In this case, since only the light shielding zone region SZR1 is shrunken as shown in FIG. 13, a slit SL unformed with the metal pattern MP is formed between the light shielding zone region SZR1 and the light shielding zone region SZR2. Accordingly, when the adjustment to shrink the light shielding zone region SZR1 is done by the mask maker, it is necessary to carryout special processing for filling the slit SL unformed with the metal pattern MP.

From the above, it is considered that in the related art in which the misregistration constituent elements exist, the mask maker performs the adjustment to shrink the light shielding zone region SZR1, but in this case, there exists room for improvement shown below. That is, when the adjustment to shrink the light shielding zone region SZR1 is done by the mask maker, there is a need to perform electron beam drawing or lithography on the light shielding zone region SZR1 and the light shielding zone region SZR2 separately to form the mask as shown in FIGS. 10 and 11. As a result, there is a possibility that a drawing misalignment will occurs between the light shielding zone region SZR1 and the light shielding zone region SZR2. There is thus a fear that an advantage due to the shrinkage of the light shielding zone region SZR1 is not obtained. It is considered that in the present embodiment 1 in particular, since the layout arrangement of the misregistration constituent elements in consideration of even the chromatic aberration is further adopted, it becomes more complex than the layout arrangement of the misregistration constituent elements in the related art, and the influence of the drawing misalignment that occurs between the light shielding zone region SZR1 and the light shielding zone region SZR2 increases. Further, when the adjustment to shrink the light shielding zone region SZR1 is done by the mask maker, the process of manufacturing the mask by the mask maker is considered to be complicated because there is a need to carry out the special processing for filling the slit SL formed between the light shielding zone region SZR1 and the light shielding zone region SZR2 as shown in FIG. 13.

When the adjustment corresponding to each misregistration constituent element is done from the initial layout data to form the mask in the mask maker, it is necessary to transmit an adjustment instruction given from the device maker to the mask maker. Since, however, the layout arrangement of the misregistration constituent elements having considered even the chromatic aberration is further adopted in the image sensor according to the embodiment 1, it is more complicated than the layout arrangement of the misregistration constituent elements in the related art, so that there is a fear about the complication of the adjustment instruction from the device maker to the mask maker. Further, since the manufacturing process of the mask by the mask maker is more completed than the manufacturing process in the related art in the manufacturing process of the image sensor according to the embodiment 1, there is also a fear that the cost of the mask will rise.

Thus, it is considered to be useful to generate by the device maker, corrected layout data to which the adjustment corresponding to each misregistration constituent element is reflected and provide the corrected layout data to the mask maker without manufacturing by the mask maker, the mask by performing the adjustments corresponding to the misregistration constituent elements from the initial layout data. This is because since the mask maker can manufacture the mask by one electron beam drawing, based on the corrected layout data generated by the device maker where the corrected layout data is presented to the mask maker, drawing misalignment due to plural times of electron beam drawing does not occur. Further, since the instruction from the device maker to the mask maker is also simplified, and the manufacturing process of the mask in the mask maker is also simplified, the manufacturing cost of the mask can be reduced. This means leading of reducing the manufacturing cost of an image sensor manufactured by the device maker.

It is thus understood that the provision of the layout data generating device by the device maker, which generates the corrected layout data to which the adjustments corresponding to the misregistration constituent elements in the embodiment 1 have been reflected realizes high performance and high reliability and is important in terms of manufacturing an image sensor capable of achieving even a cost reduction. Therefore, the present embodiment 2 will particularly describe the layout data generating device that generates the layout data for realizing the layout arrangement of the constituent elements in the embodiment 1.

Hardware Configuration of Layout Data Generating Device

Figure 14:
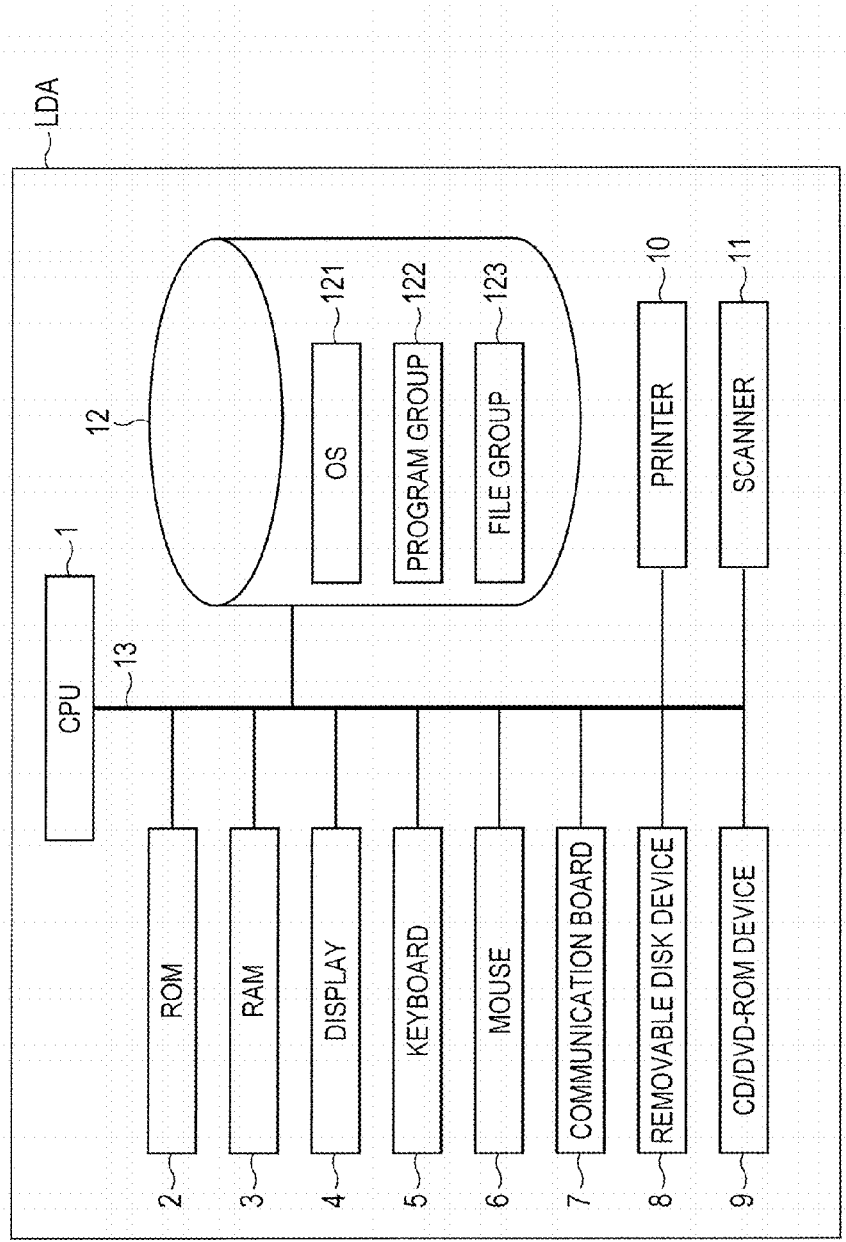
FIG. 14 is a diagram illustrating an example of a hardware configuration of a layout data generating device in an embodiment 2.

A description will first be made below about the hardware configuration of the layout data generating device in the present embodiment 2. FIG. 14 is a diagram showing an example of the hardware configuration of the layout data generating device LDA in the present embodiment 2. Incidentally, the configuration shown in FIG. 14 shows only an example of the hardware configuration of the layout data generating device LDA. The hardware configuration of the layout data generating device LDA is not limited to the configuration described in FIG. 14, but may be another configuration.

In FIG. 14, the layout data generating device LDA in the present embodiment 2 is equipped with a CPU (Central Processing Unit) 1 that executes a program. The CPU 1 is electrically coupled to, for example, a ROM (Read Only Memory) 2, a RAM (Random Access Memory) 3 and a hard disk device 12 through a bus 13 and configured to control these hardware devices.

The CPU 1 is coupled even to an input device and an output device through the bus 13. As one example of the input device, there may be mentioned a keyboard 5, a mouse 6, a communication board 7 and a scanner 11, etc. On the other hand, as one example of the output device, there may be mentioned a display 4, the communication board 7 and a printer 10, etc. Further, the CPU 1 may be coupled to, for example, a removable disk device 8 and a CD/DVD-ROM device 9.

The layout data generating device LDA may be coupled to, for example, a network. For example, when the layout data generating device LDA is coupled to another external device through the network, the communication board 7 that configures part of the layout data generating device LDA is coupled to a LAN (Local Area Network), a WAN (Wide Area Network) or Internet.

The RAM 3 is an example of a volatile memory. Each of recording media such as the ROM 2, the removable disk device 8, the CD/DVD-ROM device 9 and the hard disk device 12, is an example of a non-volatile memory. A storage device of the layout data generating device LDA is configured by these volatile and non-volatile memories.

For example, an operating system (OS) 121, a program group 122 and a file group 123 are stored in the hard disk device 12. The CPU 1 executes a program contained in the program group 122 while utilizing the operating system 121. Further, a program of the operating system 121 executed by the CPU 1, and at least part of an application program are temporarily stored in the RAM 3, and various data necessary for processing by the CPU 1 are stored in the RAM 3.

A BIOS (Basic Input Output System) program is stored in the ROM 2, and a boot program is stored in the hard disk device 12. When the layout data generating device LDA is started, the BIOS program stored in the ROM 2 and the boot program stored in the hard disk device 12 are executed and thereby the operating system 121 is started by the BIOS program and the boot program.

A program for realizing the function of the layout data generating device LDA is stored in the program group 122. This program is read and executed by the CPU 1. Further, information, data, signal values, variable values and parameters indicative of results of processing by the CPU 1 are stored in the first group 123 as respective items of a file.

The file is stored in the recording medium such as the hard disk device 12, the memory or the like. The information, data, signal values, variable values and parameters stored in the recording medium such as the hard disk device 12, the memory or the like are read into a main memory or a cache memory by the CPU 1 and used for the operation of the CPU 1 typified by extraction/retrieval/reference/comparison/computation/processing/edition/output/priting/display. For example, during the above operation of the CPU 1, the information, data, signal values, variable values and parameters are temporally stored in the main memory, register, cache memory, buffer memory, etc.

The function of the layout data generating device LDA maybe realized by firmware stored in the ROM 2. Alternatively, it maybe realized by only software, only hardware typified by element/device/substrate/wiring, a combination of software and hardware, and a combination thereof with firmware. The firmware and the software are stored in a recording medium typified by the hard disk device 12, removable disk, CD-ROM, DVD-ROM or the like as programs.

Each program is read and executed by the CPU 1. That is, the program causes a computer to function as the layout data generating device LDA.

Thus, the layout data generating device LDA in the present embodiment 2 is a computer equipped with the CPU 1 that serves as the processing device, the hard disk device 12 and the memory each of which servers as the storage device, the keyboard, mouse and communication board each of which serves as the input device, and the display, printer and communication board each of which serves as the output device. Each function of the layout data generating device LDA is realized using the above-described processing device, storage device, input device and output device.

Functional Configuration of Layout Data Generating Device

The functional configuration of the layout data generating device LDA in the present embodiment 2 will subsequently be described. The layout data generating device LDA in the present embodiment 2 is a device that generates the layout data indicative of the layout arrangement of the constituent elements of the image sensor described in the embodiment 1. The configuration of the image sensor according to the embodiment 1 is premised.

That is, the image sensor according to the embodiment 1 is equipped with a plurality of pixels which respectively have photoelectric conversion units (photodiodes) that convert incident light into electrical charges and are arranged in a matrix form in units of basic patterns, and optical members each arranged on the incidence side of the incident light than the pixels and having constituent elements respectively corresponding to the pixels. At this time, for example, a red pixel, a green pixel and a blue pixel are contained in the pixels. The basic pattern is comprised of a layout pattern in which the red, green and blue pixels are combined, as typified by a Bayer array, for example. The device that generates the layout data indicative of the arrangement positions of the constituent elements configuring each optical member of the image sensor according to the embodiment 1 configured in this way is the layout data generating device according to the embodiment 2. As the optical member, there may be mentioned, for example, a "light shielding zone". As the constituent element of the optical member, there may be mentioned a "light penetration unit". The optical member and the constituent element are not however limited to them. As the optical member, there may be mentioned a "color filter". As the constituent element, there may also be mentioned a "red filter", a "green filter", and a "blue filter". Further, as the optical member, there may be mentioned a "microlens group", and as the constituent element, there may also be mentioned a "microlens".

Figure 15:
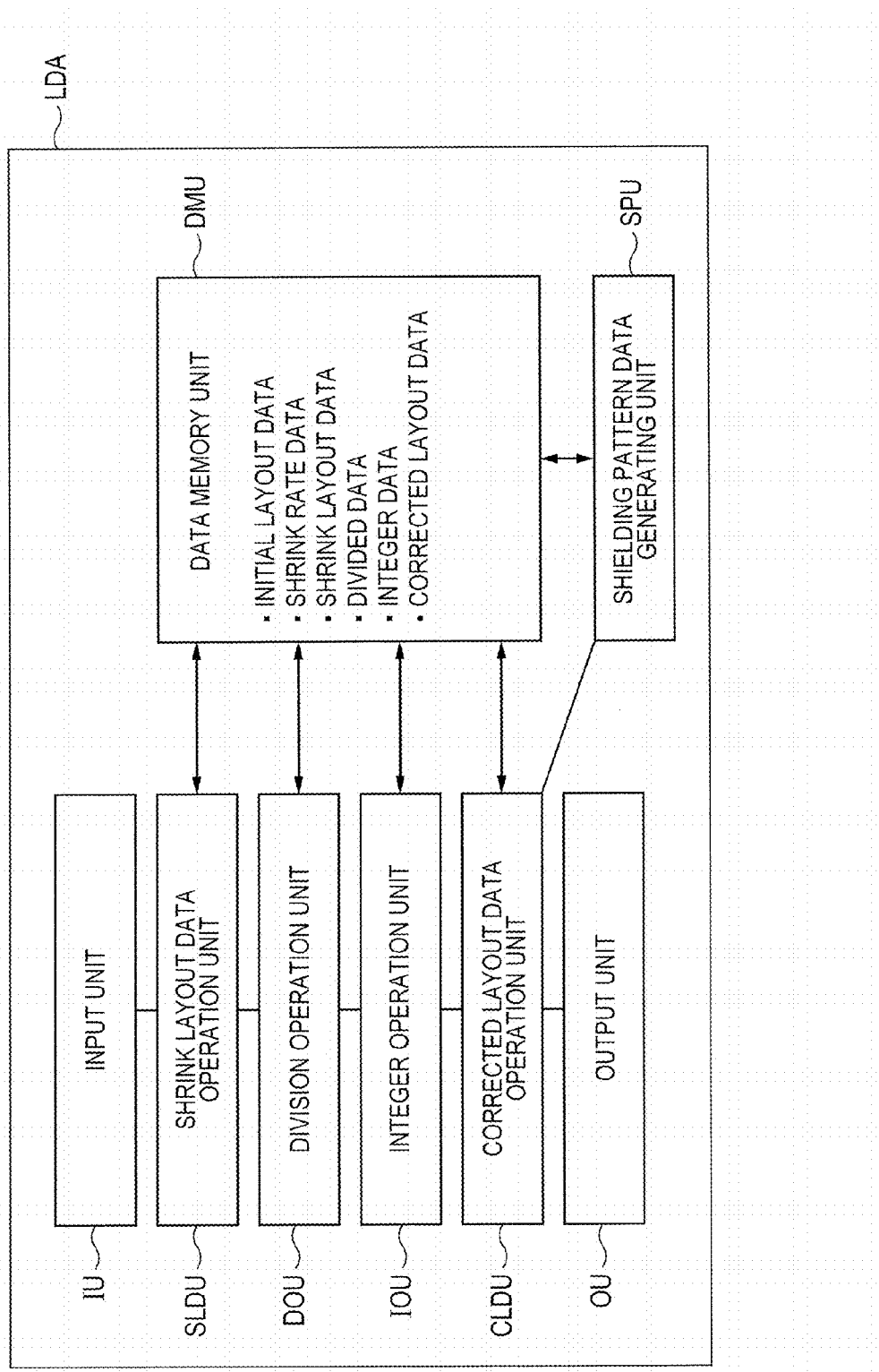
FIG. 15 is a diagram showing a functional block diagram of the layout data generating device in the embodiment 2.

FIG. 15 is a diagram showing a functional block diagram of the layout data generating device LDA in the present embodiment 2. In FIG. 15, the layout data generating device LDA in the present embodiment 2 has an input unit IU, a shrink layout data operation unit SLDU, a division operation unit DOU, an integer operation unit IOU, a corrected layout data operation unit CLDU, an output unit OU and a data memory unit DMU.

The input unit IU is configured to be inputted with initial layout data indicative of respective initial arrangement positions of a plurality of constituent elements arranged planarly in the same positions as those of, for example, a plurality of photoelectric conversion units (photodiodes), and shrink rate data indicative of rates at which respective arrangement positions of a plurality of constituent elements are shrunken. Further, the input unit IU is configured to be inputted with pitch data indicative of pitches at which the pixels are arranged, origin coordinate data indicative of origin coordinates of a pixel array, grid data indicative of a digitized unit, etc.

The initial layout data, shrink rate data, pitch data, origin coordinate data, grid data, etc. inputted from the input unit IU to the layout data generating device LDA are stored in the data memory unit DMU.

Here, in the present embodiment 2, the red, green and blue pixels are contained in plural pixels. Therefore, first initial layout data indicative of an initial arrangement position of a constituent element corresponding to the red pixel, second initial layout data indicative of an initial arrangement position of a constituent element corresponding to a green pixel, and third initial layout data indicative of an initial arrangement position of a constituent element corresponding to the blue pixel are included in the initial layout data.

Specifically, the initial layout data is comprised of, for example, a plurality of first coordinate data indicative of respective positions of a plurality of constituent elements in a first direction with the position of center of a pixel array comprised of a plurality of pixels as a reference, and a plurality of second coordinate data indicative of respective positions of a plurality of constituent elements in a second direction orthogonal to the first direction.

Further, in the embodiment 1, in the basic pattern BP2 of FIG. 9, for example, the amount of misregistration of the constituent element CER2 corresponding to the red pixel is smaller than the amount of misregistration of the constituent element CEG2 corresponding to the green pixel. In addition, the amount of misregistration of the constituent element CEB2 corresponding to the blue pixel is larger than the amount of misregistration of the constituent element CEG2 corresponding to the green pixel.

This means that the shrink rate data of the constituent element corresponding to the red pixel, the shrink rate data of the constituent element corresponding to the green pixel, and the shrink rate data of the constituent element corresponding to the blue pixel are different in value from each other. Thus, first shrink rate data indicative of a shrink rate of the constituent element corresponding to the red pixel, and second shrink rate data indicative of a shrink rate of the constituent element corresponding to the green pixel and smaller than the first shrink rate data in value are included in the shrink rate data inputted in the present embodiment 2. Further, third shrink rate data indicative of a shrink rate of the constituent element corresponding to the blue pixel and smaller than the second shrink rate data in value are included in the shrink rate data inputted in the present embodiment 2.

Further, since the red, green and blue pixels included in a plurality of pixels are arranged in an array form in a Bayer array, the pitch between the red pixels, the pitch between the green pixels, and the pitch between the blue pixels are different from each other. From this, first pitch data corresponding to the pitch between the red pixels, second pitch data corresponding to the pitch between the green pixels, and third pitch data corresponding to the pitch between the blue pixels are included in the pitch data inputted from the input unit IU.

Next, the shrink layout data operation unit SLDU is configured to calculate shrink layout data indicative of a shrunken arrangement position of an initial arrangement position from the initial layout data, based on the shrink rate data inputted from the input unit IU. The shrink layout data operation unit SLDU is realized by operating the CPU 1 by the program group 122 stored in the hard disk device 12 of FIG. 14, for example.

Here, in the present embodiment 2, the red, green and blue pixels are included in a plurality of pixels. Therefore, first shrink layout data indicative of an arrangement position where an initial arrangement position of a constituent element corresponding to the red pixel is shrunken, and second shrink layout data indicative of an arrangement position where an initial arrangement position of a constituent element corresponding to the green pixel is shrunken, are included in the shrink layout data. Further, third shrink layout data indicative of an arrangement position where an initial arrangement position of a constituent element corresponding to the blue pixel is shrunken, is included in the shrink layout data.

Thus, the shrink layout data operation unit SLDU is configured to calculate the first shrink layout data from the first initial layout data, based on the first shrink rate data and calculate the second shrink layout data from the second initial layout data, based on the second shrink rate data. Further, the shrink layout data operation unit SLDU is configured to calculate the third shrink layout data from the third initial layout data, based on the third shrink rate data. The shrink layout data calculated by the shrink layout data operation unit SLDU in this way are stored in the data memory unit DMU shown in FIG. 15.

Incidentally, the shrink layout data is also comprised of, for example, a plurality of first coordinate data, and a plurality of second coordinate data. In this case, the shrink layout data operation unit SLDU multiplies a plurality of first coordinate data of initial layout data by shrink rate data respectively, for example to thereby calculate a plurality of first coordinate data of shrink layout data respectively. Similarly, the shrink layout data operation unit SLDU multiplies a plurality of second coordinate data of initial layout data by shrink rate data respectively, for example to thereby calculate a plurality of second coordinate data of shrink layout data respectively.

Subsequently, the division operation unit DOU divides shrink layout data by the grid data indicative of the unit to digitize the shrink layout data calculated by the shrink layout data operation unit SLDU to calculate divided data. This division operation unit DOU is realized by operating the CPU 1 by the program group 122 stored in the hard disk device 12 of FIG. 14, for example.

Here, in the present embodiment 2, the red, green and blue pixels are included in a plurality of pixels. Therefore, the divided data includes first divided data corresponding to the first shrink layout data, second divided data corresponding to the second shrink layout data, and third divided data corresponding to the third shrink layout data.

Accordingly, the division operation unit DOU is configured to divide the first shrink layout data by the grid data to calculate the first divided data, and divide the second shrink layout data by the grid data to calculate the second divided data. Further, the division operation unit DOU is configured to divide the third shrink layout data by the grid data to calculate the third divided data. The divided data calculated by the division operation unit DOU in this way are stored in the data memory unit DMU shown in FIG. 15.

Next, when numeric data after a decimal point is included in the divided data calculated by the division operation unit DOU, the integer operation unit IOU is configured to perform integer processing on the divided data to calculate integer data. Specifically, for example, the integer operation unit IOU is configured to calculate integer data by the process of discarding or rounding down the numeric data after the decimal point included in the divided data. The integer operation unit IOU is realized by operating the CPU 1 by the program group 122 stored in the hard disk device 12 of FIG. 14, for example.

Here, in the present embodiment 2, the red, green and blue pixels are included in a plurality of pixels. Therefore, first integer data corresponding to the first divided data, second integer data corresponding to the second divided data, and third integer data corresponding to the third divided data are included in the integer data.

Accordingly, the integer operation unit IOU is configured to perform integer processing on the first divided data to calculate the first integer data, perform integer processing on the second divided data to calculate the second integer data and perform integer processing on the third divided data to calculate the third integer data. The integer data calculated by the integer operation unit IOU in this manner are stored in the data memory unit DMU shown in FIG. 15.

Subsequently, the corrected layout data operation unit CLDU is configured to calculate corrected layout data indicative of the digitized shrink layout data by multiplying the grid data and the integer data. The corrected layout data operation unit CLDU is realized by operating the CPU 1 by the program 122 stored in the hard disk device 12 of FIG. 14, for example.

Here, in the present embodiment 2, the red, green and blue pixels are included in a plurality of pixels. Therefore, the corrected layout data includes first corrected layout data indicative of a correction position of a constituent element corresponding to the red pixel, second corrected layout data indicative of a correction position of a constituent element corresponding to the green pixel, and third corrected layout data indicative of a correction position of a constituent element corresponding to the blue pixel.

Accordingly, the corrected layout data operation unit CLDU is configured to calculate the first corrected layout data by multiplying the grid data and the first integer data and calculate the second corrected layout data by multiplying the grid data and the second integer data. Further, the corrected layout data operation unit CLDU is configured to calculate the third corrected layout data by multiplying the grid data and the third integer data. The corrected layout data calculated by the corrected layout data operation unit CLDU in this way are stored in the data memory unit DMU shown in FIG. 15.

At last, the output unit OU is configured to output the corrected layout data calculated by the corrected layout data operation unit CLDU.

Layout Data Generating Method

The layout data generating device LDA in the present embodiment 2 is configured in the above-described manner. A layout data generating method using the layout data generating device LDA will hereinafter be described with reference to the accompanying drawings.

In the Case of Odd-Numbered Array

Figure 16:
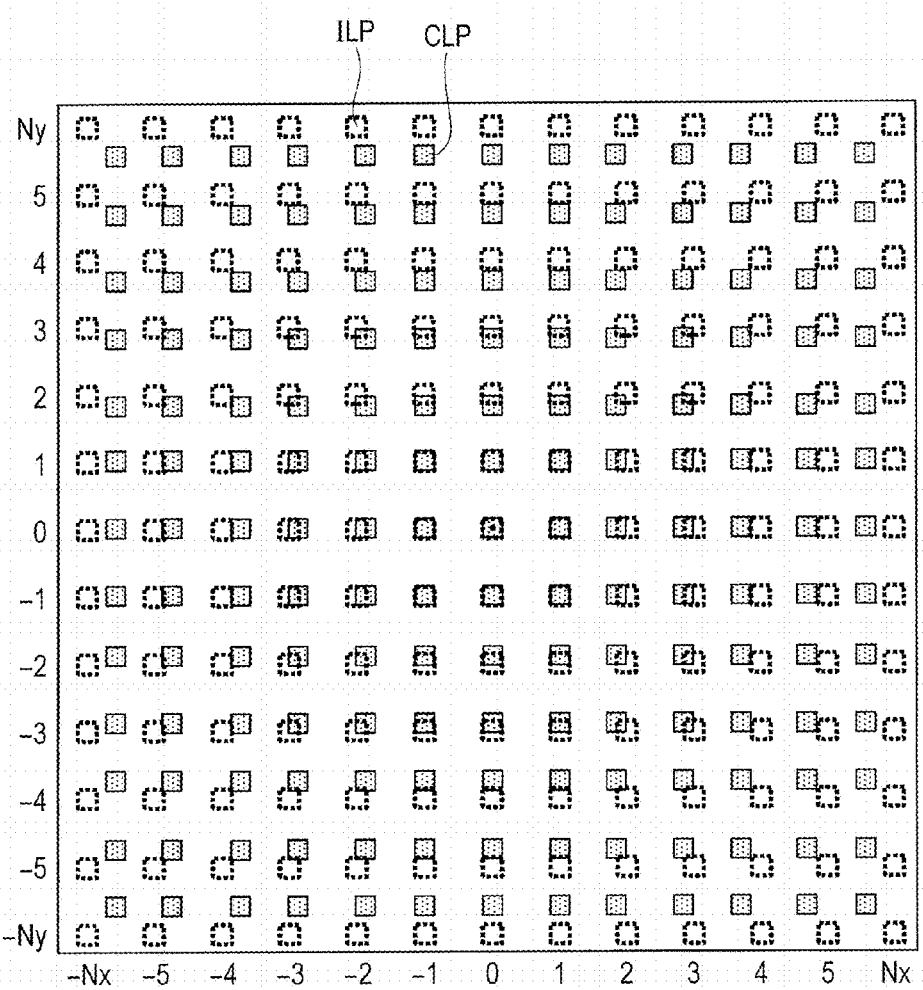
FIG. 16 is a typical diagram depicting a layout arrangement example in which constituent elements of an optical member are arranged in an odd-numbered array.

A description will first be made about a layout data generating method where the arrangement of constituent elements of an optical member is an odd-numbered array. FIG. 16 is a typical diagram showing a layout arrangement example in which constituent elements of an optical member are arranged in an odd-numbered array. In FIG. 16, each point indicated by a broken line indicates an initial layout arrangement position ILP of each constituent element of the optical member. Each of points indicated by dots indicates a correction layout arrangement position CLP of each constituent element of the optical member. In the layout data generating method in the present embodiment 2, there is provided a method for performing arithmetic processing on initial layout data indicative of each initial layout arrangement position ILP to thereby finally generate corrected layout data indicative of each correction layout data arrangement position CLP. The layout data generating method in the present embodiment 2 will hereinafter be described.

Figure 17:
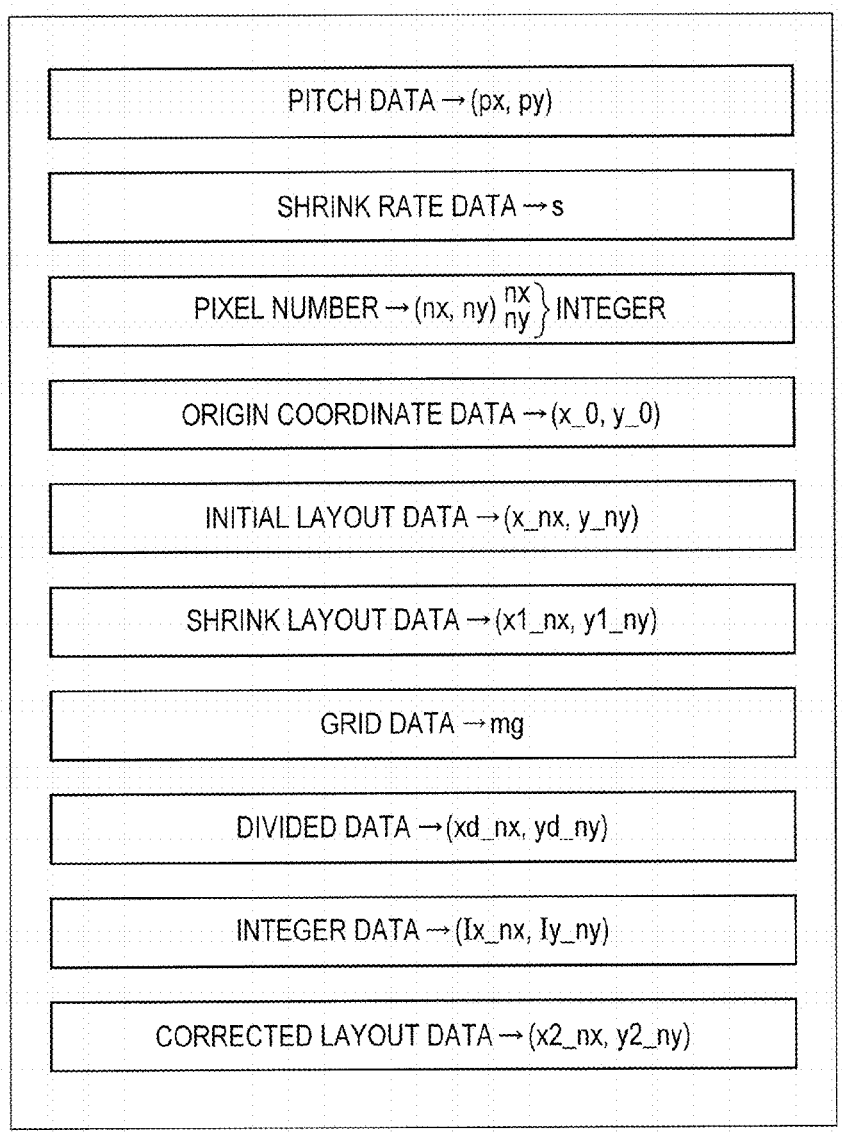
FIG. 17 is a table showing an example representing various data used in a layout data generating method in the embodiment 2.

Here, FIG. 17 is a table showing an example representing various data used in the layout data generating method in the present embodiment 2. In the layout data generating method described in the present embodiment 2, the various data are represented as shown below:

Pitch data→(px, py)
Shrink rate data→s
Pixel number→(nx, ny)
—Nx≤nx≤Nx
—Ny≤nx≤Ny
Origin coordinate data→(x_0, y_0)
Initial layout data→(x_nx, y_ny)
Shrink layout data→(x1_nx, y1_ny)
Grid data→mg
Divided data→(xd_nx, yd_ny)
Integer data→(1x_nx, 1y_ny)
Corrected layout data→(x2_nx, y2_ny)

Figure 18:
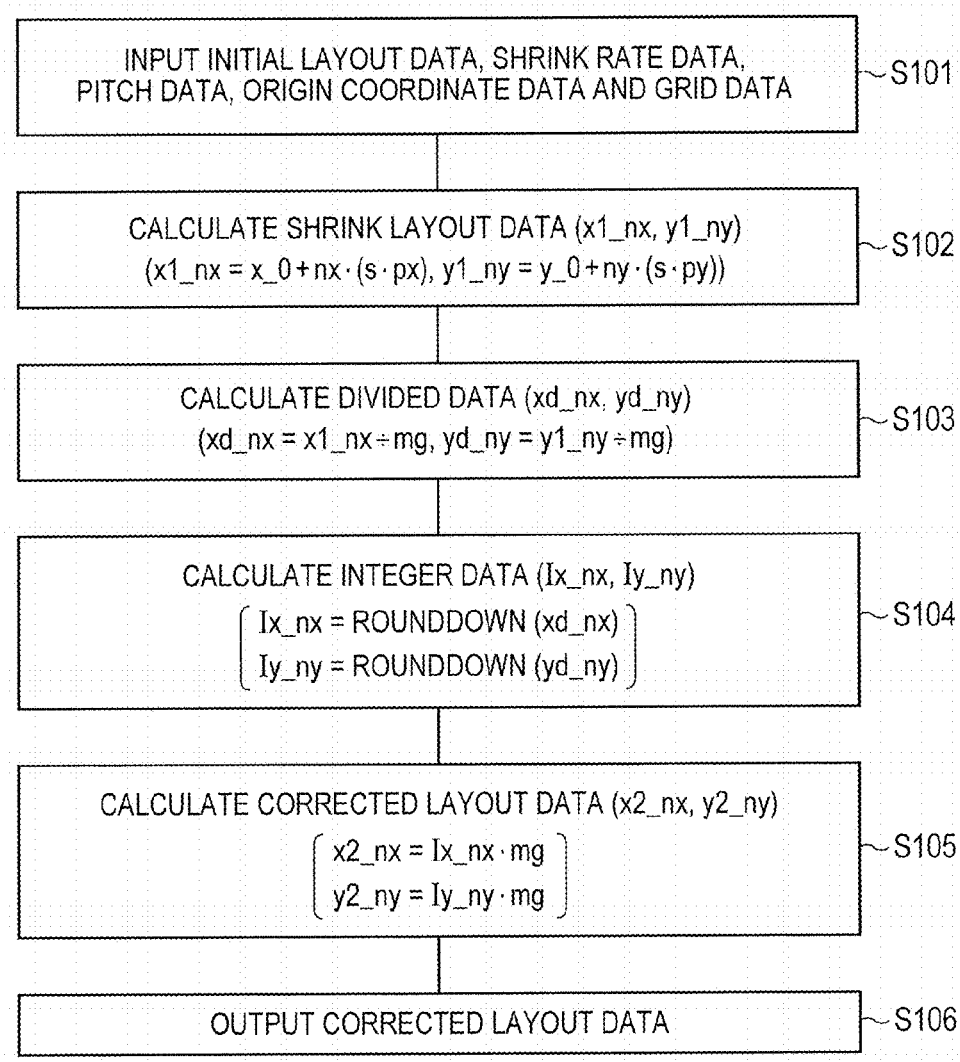
FIG. 18 is a flowchart for describing the layout data generating method in the embodiment 2.

FIG. 18 is a flowchart for describing the layout data generating method in the present embodiment 2. The layout data generating method in the present embodiment 2 will be described below based on FIG. 18.

First, the layout data generating device LDA is inputted with the initial layout data, shrink rate data, pitch data, origin coordinate data, grid data, etc. by the input unit IU shown in FIG. 15 (S101 of FIG. 18). These data are stored in the data memory unit DMU shown in FIG. 15, for example.

Next, the shrink layout data operation unit SLDU shown in FIG. 15 calculates shrink layout data indicative of an arrangement position where an initial arrangement position is shrunken, from the initial layout data, based on the shrink rate data, pitch data, origin coordinate data, etc. inputted from the input unit IU. Specifically, the shrink layout data operation unit SLDU performs arithmetic processing shown in equations (1) and (2) by the CPU 1 shown in FIG. 14 (S102 of FIG. 18). Then, the shrink layout data calculated by the shrink layout data operation unit SLDU is stored in the data memory unit DMU shown in FIG. 15, for example.

$$x1\_nx = x\_0 + nx \cdot (s \cdot px) \quad (1)$$

$$y1\_ny = y\_0 + ny \cdot (s \cdot py) \quad (2)$$

Subsequently, the division operation unit DOU shown in FIG. 15 divides the shrink layout data by grid data indicative of a unit to digitize the shrink layout data calculated by the shrink layout data operation unit SLDU to calculate divided data. Specifically, the division operation unit DOU performs arithmetic processing shown in equations (3) and (4) by the CPU 1 shown in FIG. 14 (S103 of FIG. 18). The divided data calculated by the division operation unit DOU is stored in the data memory unit DMU shown in FIG. 15, for example.

$$xd\_nx = x1\_nx + mg \quad (3)$$

$$yd\_ny = y1\_ny + mg \quad (4)$$

Thereafter, when numeric data after a decimal point is included in the divided data calculated by the division operation unit DOU, the integer operation unit IOU shown in FIG. 15 performs integer processing on the divided data to calculate integer data. For example, the integer operation unit IOU calculates integer data by the process of rounding down the numeric data after the decimal point included in the divided data. Specifically, the integer operation unit IOU performs arithmetic processing shown in equations (5) and (6) by the CPU 1 shown in FIG. 14 (S104 of FIG. 18). Then, the integer data calculated by the integer operation unit IOU is stored in the data memory unit DMU shown in FIG. 15, for example. Incidentally, when the numeric data after the decimal point is not included in the divided data calculated by the division operation unit DOU, the divided data is taken as integer data as it is.

$$1x\_nx = \mathrm{ROUNDDOWN}(xd\_nx) \quad (5)$$

$$1y\_ny = \mathrm{ROUNDDOWN}(yd\_ny) \quad (6)$$

Next, the corrected layout data operation unit CLDU shown in FIG. 15 multiplies the grid data and the integer data to thereby calculate corrected layout data indicative of digitized shrink layout data. Specifically, the corrected layout data operation unit CLDU performs arithmetic processing shown in equations (7) and (8) by the CPU 1 shown in FIG. 14 (S105 of FIG. 18). Then, the corrected layout data calculated by the corrected layout operation unit CLDU is stored in the data storage unit DMU shown in FIG. 15, for example.

$$x2\_nx = 1x\_nx \cdot mg \quad (7)$$

$$y2\_ny = 1y\_ny \cdot mg \quad (8)$$

Thereafter, the output unit OU shown in FIG. 15 outputs the corrected layout data calculated by the corrected layout data operation unit CLDU (S106 of FIG. 18). In the layout arrangement in which the constituent elements of each optical member are arranged in the odd-numbered array, the corrected layout data of each constituent element can be generated in the above-described manner.

Incidentally, since the constituent element corresponding to the red pixel, the constituent element corresponding to the green pixel, and the constituent element corresponding to the blue pixel exist actually, corrected layout data are generated with respect to the respective constituent elements by using the shrink rate data considering the chromatic aberration. That is, in the present embodiment 2, the corrected layout data are generated separately with respect to the constituent element corresponding to the red pixel, the constituent element corresponding to the green pixel and the constituent element corresponding to the blue pixel.

Specifically, in the constituent element corresponding to the red pixel, first shrink layout data is calculated from first initial layout data on the basis of first shrink rate data. First corrected layout data is generated based on the calculated first shrink layout data. Also in the constituent element corresponding to the green pixel, second shrink layout data is calculated from second initial layout data on the basis of second shrink rate data. Second corrected layout data is generated based on the calculated second shrink layout data. Further, in the constituent element corresponding to the blue pixel, third shrink layout data is calculated from third initial layout data on the basis of third shrink rate data. Third corrected layout data is generated based on the calculated third shrink layout data.

In the Case of Even-Numbered Array

Figure 19:
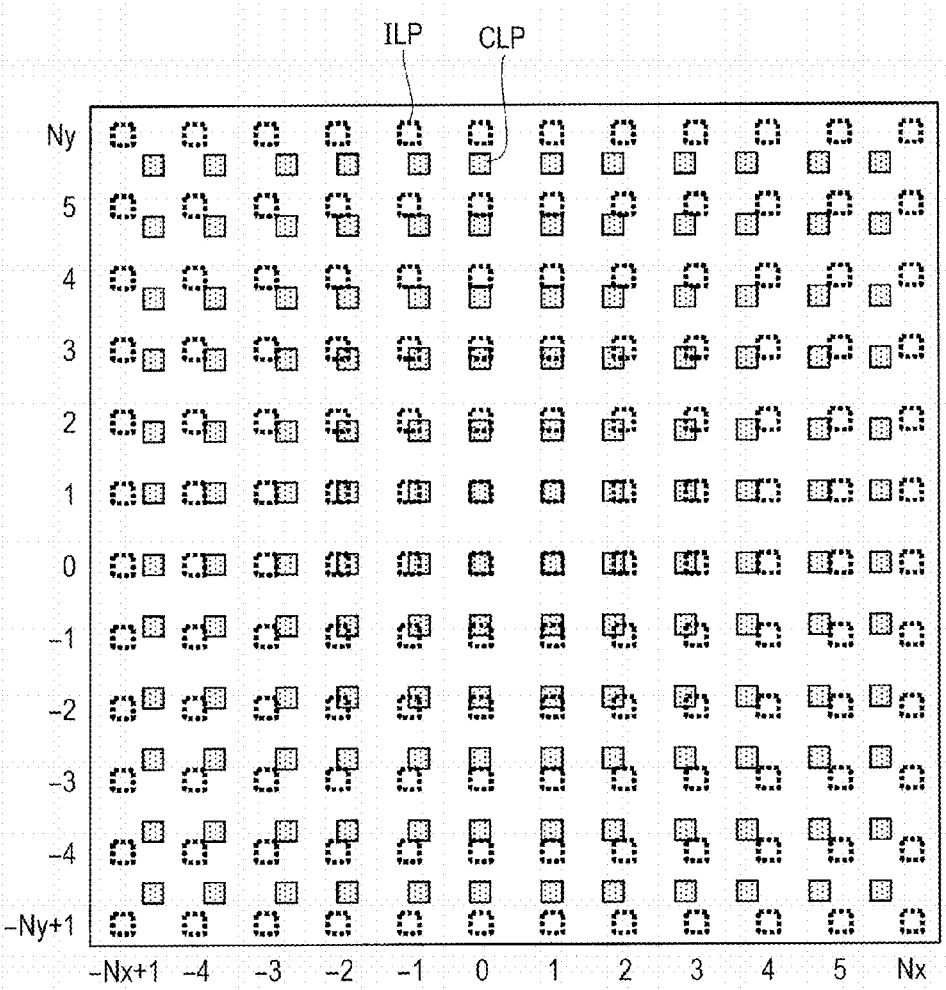
FIG. 19 is a typical diagram showing a layout arrangement example in which constituent elements of an optical member are arranged in an even-numbered array.

A description will next be made about a layout data generating method where the arrangement of constituent elements of an optical member is an even-numbered array. FIG. 19 is a typical diagram showing a layout arrangement example in which constituent elements of an optical member are arranged in an odd-numbered array. In FIG. 19, each point indicated by a broken line indicates an initial layout arrangement position ILP of each constituent element of the optical member. Each of points indicated by dots indicates a correction layout arrangement position CLP of each constituent element of the optical member. In the layout data generating method in the present embodiment 2, there is provided a method for performing arithmetic processing on initial layout data indicative of each initial layout arrangement position ILP to thereby finally generate corrected layout data indicative of each correction layout data arrangement position CLP. The layout data generating method in the present embodiment 2 will hereinafter be described.

Here, in the layout data generating method described in the present embodiment 2, various data are represented as shown below:

Pitch data→(px, py)
Shrink rate data→s
Pixel number→(nx, ny)
—Nx+1≤nx≤Nx
—Ny+1≤nx≤Ny
Origin coordinate data→(x_0, y_0)
Initial layout data→(x_nx, y_ny)
Shrink layout data→(x1_nx, y1_ny)
Grid data→mg
Divided data→(xd_nx, yd_ny)
Integer data→(1x_nx, 1y_ny)
Corrected layout data→(x2_nx, y2_ny)

Figure 20:
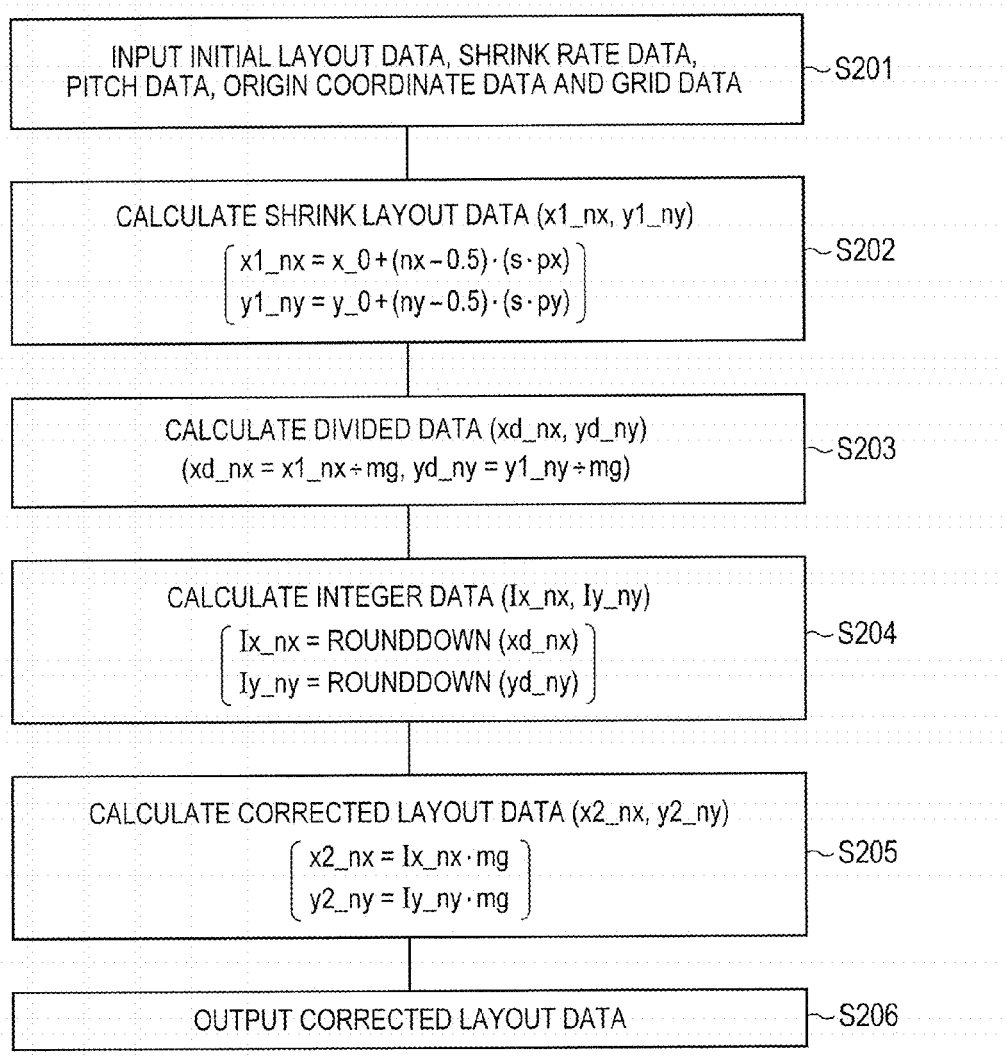
FIG. 20 is a flowchart for describing the layout data generating method in the embodiment 2.

FIG. 20 is a flowchart for describing the layout data generating method in the present embodiment 2. The layout data generating method in the present embodiment 2 will be described below based on FIG. 20.

First, the layout data generating device LDA is inputted with the initial layout data, shrink rate data, pitch data, origin coordinate data, grid data, etc. by the input unit IU shown in FIG. 15 (S201 of FIG. 20). These data are stored in the data memory unit DMU shown in FIG. 15, for example.

Next, the shrink layout data operation unit SLDU shown in FIG. 15 calculates shrink layout data indicative of an arrangement position where an initial arrangement position is shrunken, from the initial layout data, based on the shrink rate data, pitch data, origin coordinate data, etc. inputted from the input unit IU. Specifically, the shrink layout data operation unit SLDU performs arithmetic processing shown in equations (9) and (10) by the CPU 1 shown in FIG. 14 (S202 of FIG. 20). Then, the shrink layout data calculated by the shrink layout data operation unit SLDU is stored in the data memory unit DMU shown in FIG. 15, for example.

$$x1\_nx = x\_0 + (nx - 0.5) \cdot (s \cdot px) \quad (9)$$

$$y1\_ny = y\_0 + (ny - 0.5) \cdot (s \cdot py) \quad (10)$$

Subsequently, the division operation unit DOU shown in FIG. 15 divides the shrink layout data by grid data indicative of a unit to digitize the shrink layout data calculated by the shrink layout data operation unit SLDU to calculate divided data. Specifically, the division operation unit DOU performs arithmetic processing shown in equations (11) and (12) by the CPU 1 shown in FIG. 14 (S203 of FIG. 20). The divided data calculated by the division operation unit DOU is stored in the data memory unit DMU shown in FIG. 15, for example.

$$xd\_nx = x1\_nx \div mg \quad (11)$$

$$yd\_ny = y1\_ny \div mg \quad (12)$$

Thereafter, when numeric data after a decimal point is included in the divided data calculated by the division operation unit DOU, the integer operation unit IOU shown in FIG. 15 performs integer processing on the divided data to calculate integer data. For example, the integer operation unit IOU calculates integer data by the process of rounding down the numeric data after the decimal point included in the divided data. Specifically, the integer operation unit IOU performs arithmetic processing shown in equations (13) and (14) by the CPU 1 shown in FIG. 14 (S204 of FIG. 20). Then, the integer data calculated by the integer operation unit IOU is stored in the data memory unit DMU shown in FIG. 15, for example. Incidentally, when the numeric data after the decimal point is not included in the divided data calculated by the division operation unit DOU, the divided data is taken as integer data as it is.

$$1x\_nx = \text{ROUNDDOWN}(xd\_nx) \quad (13)$$

$$1y\_ny = \text{ROUNDDOWN}(yd\_ny) \quad (14)$$

Next, the corrected layout data operation unit CLDU shown in FIG. 15 multiplies the grid data and the integer data to thereby calculate corrected layout data indicative of digitized shrink layout data. Specifically, the corrected layout data operation unit CLDU performs arithmetic processing shown in equations (15) and (16) by the CPU 1 shown in FIG. 14 (S205 of FIG. 20). Then, the corrected layout data calculated by the corrected layout operation unit CLDU is stored in the data storage unit DMU shown in FIG. 15, for example.

$$x2\_nx = 1x\_nx \cdot mg \quad (15)$$

$$y2\_ny = 1y\_ny \cdot mg \quad (16)$$

Thereafter, the output unit OU shown in FIG. 15 outputs the corrected layout data calculated by the corrected layout data operation unit CLDU (S206 of FIG. 20). In the layout arrangement in which the constituent elements of each optical member are arranged in the even-numbered array, the corrected layout data of each constituent element can be generated in the above-described manner.

Incidentally, since the constituent element corresponding to the red pixel, the constituent element corresponding to the green pixel, and the constituent element corresponding to the blue pixel exist actually, corrected layout data are generated with respect to the respective constituent elements by using the shrink rate data considering the chromatic aberration. That is, in the present embodiment 2, the corrected layout data are generated separately with respect to the constituent element corresponding to the red pixel, the constituent element corresponding to the green pixel and the constituent element corresponding to the blue pixel.

Specifically, in the constituent element corresponding to the red pixel, first shrink layout data is calculated from first initial layout data on the basis of first shrink rate data. First corrected layout data is generated based on the calculated first shrink layout data. Also in the constituent element corresponding to the green pixel, second shrink layout data is calculated from second initial layout data on the basis of second shrink rate data. Second corrected layout data is generated based on the calculated second shrink layout data. Further, in the constituent element corresponding to the blue pixel, third shrink layout data is calculated from third initial layout data on the basis of third shrink rate data. Third corrected layout data is generated based on the calculated third shrink layout data.

Advantageous Effects in Embodiment 2

(1) According to the layout data generating device in the present embodiment 2, the layout arrangement of the constituent elements described in the embodiment 1 can be realized.

(2) In particular, according to the present embodiment 2, the device maker is capable of generating the corrected layout data to which the adjustment corresponding to each misregistration constituent element has been reflected, without manufacturing the mask by the mask maker by performing the adjustment corresponding to each misregistration constituent element from the initial layout data. As a result, it is possible to provide the corrected layout data generated by the device maker to the mask maker. It is therefore possible to prevent drawing misalignment due to a plurality of times of electron beam drawing because the mask can be manufactured by one electron beam drawing, based on the corrected layout data. It is thus possible to manufacture a highly accurate mask high in reliability by using the layout data generating device in the present embodiment 2. Consequently, an image sensor of high performance and high reliability can be provided.

(3) Further, according to the present embodiment 2, the instruction from the device maker to the mask maker is also simplified, and the manufacturing process of the mask in the mask maker is also simplified, thus making it possible to reduce the manufacturing cost of the mask. As a result, the use of the layout data generating device in the present embodiment 2 enables a reduction in the manufacturing cost of the image sensor manufactured by the device maker.

Layout Data Generating Program

The layout data generating method executed in the above-described layout data generating device LDA can be realized by a layout data generating program that causes a computer to execute layout data generating processing. For example, in the layout data generating device LDA comprised of the computer shown in FIG. 14, the layout data generating program in the present embodiment 2 is introduced as one program group 122 stored in the hard disk device 12, and the computer that serves as the layout data generating device LDA is caused to execute the layout data generating program, whereby the layout data generating method in the present embodiment 2 is realized.

The layout data generating program for causing the computer to execute each processing for generating layout data can be recorded and distributed in recoding media readable by the computer. Such recording media include, for example, a magnetic recording medium such as a hard disk, a flexible disk or the like, an optical recording medium such as a CD-ROM, a DVD-ROM or the like, a hardware device typified by a non-volatile memory such as a ROM, an EEPROM or the like, etc.

Modification 1

In the embodiment 2, the integer operation unit IOU has been configured to calculate the integer data by the process of rounding down the numeric data after the decimal point included in the divided data. The arithmetic processing for calculating the integer data is not however limited to it. As shown in FIG. 21, for example, the integer operation unit IOU may be configured to calculate integer data by the process of rounding up numeric data after a decimal point included in divided data (S304 of FIG. 21). That is, the integer operation unit IOU can also be configured to execute arithmetic processing shown in equations (17) and (18) by the CPU 1 shown in FIG. 14.

$$1x\_nx = \text{ROUNDUP}(xd\_nx) \quad (17)$$

$$1y\_ny = \text{ROUNDUP}(yd\_ny) \quad (18)$$

Modification 2

In the embodiment 2, the integer operation unit IOU has been configured to calculate the integer data by the process of rounding down the numeric data after the decimal point included in the divided data. The arithmetic processing for generating the integer data is not however limited to it. As shown in FIG. 22, for example, the integer operation unit IOU may be configured to calculate integer data by the process of rounding off numeric data after a decimal point included in divided data (S404 of FIG. 22). That is, the integer operation unit IOU can also be configured to execute arithmetic processing shown in equations (19) and (20) by the CPU 1 shown in FIG. 14.

$$1x\_nx = \text{ROUNDOFF}(xd\_nx) \quad (19)$$

$$1y\_ny = \text{ROUNDOFF}(yd\_ny) \quad (20)$$

Modification 3

In the present modification 3, a description will be made about an example using the layout data generating device LDA in the embodiment 2, for example where a light shielding zone is taken as an optical member by way of example, and light shielding pattern data for a mask for forming the light shielding zone is generated.

As shown in FIG. 15, the layout data generating device LDA further has a shielding pattern data generating unit SPU that generates light shielding pattern data indicative of a pattern of a light shielding zone. The shielding pattern data generating unit SPU is configured to generate light shielding pattern data by performing arithmetic processing based on the corrected layout data calculated by the corrected layout data operation unit CLDU on solid pattern data taken as the base of each light shielding pattern.

Figure 23:
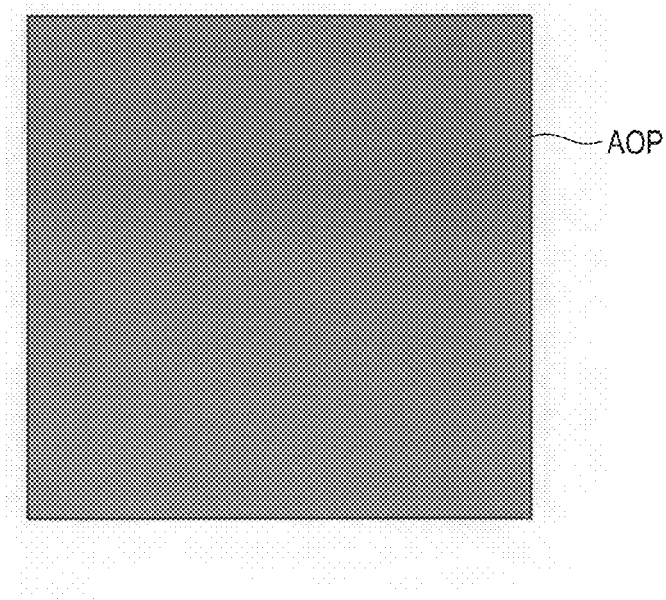
FIG. 23 is a diagram for describing processing of a shielding pattern data generating unit in a modification 3.
Figure 24:
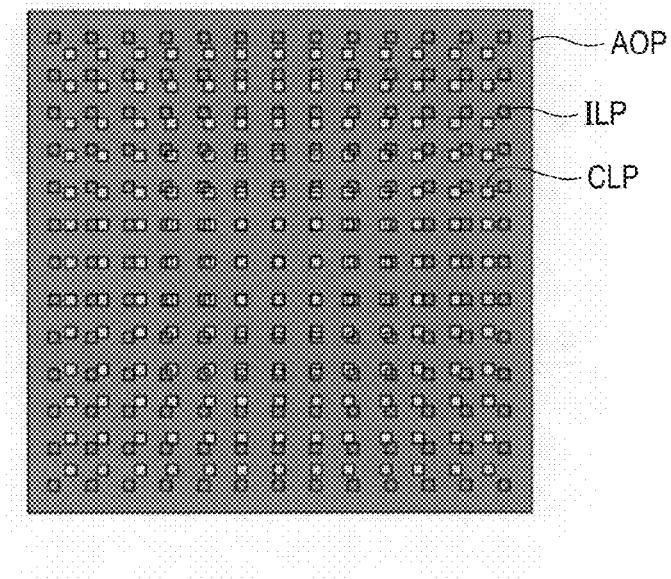
FIG. 24 is a diagram for describing processing of the shielding pattern data generating unit in the modification 3.

Specifically, the shielding pattern data generating unit SPU prepares in advance solid pattern data for such a solid pattern AOP as shown in FIG. 23. Further, the corrected layout data operation unit CLDU of the above-described layout data generating device LDA performs arithmetic processing on initial layout data indicative of each initial layout arrangement position ILP shown in FIG. 24 to thereby finally generate corrected layout data indicative of a correction layout arrangement position CLP.

Figure 25:
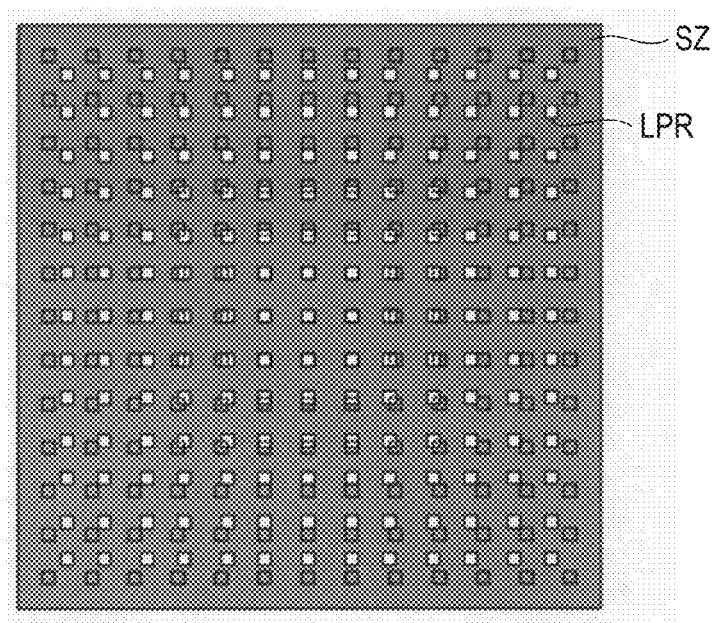
FIG. 25 is a diagram for describing processing of the shielding pattern data generating unit in the modification 3.

Then, the shielding pattern data generating unit SPU performs arithmetic processing based on the corrected layout data calculated by the corrected layout data operation unit CLDU on solid pattern data taken as the base of each light shielding pattern. For example, the shielding pattern data generating unit SPU performs processing (NOT processing) for subtracting position data of a light penetration unit indicated by the corrected layout data from the solid pattern data. As shown in FIG. 25, for example, it is possible to generate light shielding pattern data of a mask corresponding to a mesh-like light shielding zone SZ provided with each light penetration unit LPR at a place indicated by the corrected layout data.

While the invention made above by the present inventors has been described specifically on the basis of the embodiments, the present invention is not limited to the embodiments referred to above. It is needless to say that various changes can be made thereto within the scope not departing from the gist thereof.

The above embodiments include the following modes.

(Appendix 1)

A layout data generating program for causing a computer to execute the generation of layout data indicative of arrangement positions of a plurality of constituent elements configuring an optical member of a solid-state imaging device including:

a plurality of pixels respectively having photoelectric conversion units each converting incident light into an electric charge and arranged in a matrix form in units of basic patterns, and the optical member arranged on the incidence side of the incident light than the pixels and having the constituent elements respectively corresponding to the pixels, in which the pixels include:

a first wavelength range light pixel that makes first wavelength range light included in the incident light incident, a second wavelength range light pixel that makes incident second wavelength range light included in the incident light and shorter in wavelength than the first wavelength range light, and a third wavelength range light pixel that makes incident third wavelength range light included in the incident light and shorter in wavelength than the second wavelength range light, in which each of the basic patterns is comprised of an arrangement pattern formed by combining the first wavelength range light pixel, the second wavelength range light pixel and the third wavelength range light pixel, in which the layout data generating program includes:

(a) a process for inputting initial layout data indicative of respective initial arrangement positions of the constituent elements arranged in the same positions as the photoelectric conversion units planarly, and shrink rate data indicative of rates at which the respective arrangement positions of the constituent elements are shrunken, (b) a process for calculating shrink layout data indicative of arrangement positions where the initial arrangement positions are shrunken, from the initial layout data, based on the shrink rate data inputted in the (a) process, (c) a process for dividing the shrink layout data by grid data indicative of a unit to digitize the shrink layout data to calculate divided data, (d) a process for performing integer processing on the divided data when numeric data after a decimal point is included in the divided data, to calculate integer data, (e) a process for multiplying the grid data and the integer data to thereby calculate corrected layout data indicative of the digitized shrink layout data, and (f) a process for outputting the corrected layout data, in which the initial layout data includes:

first initial layout data indicative of the initial arrangement position of the constituent element corresponding to the first wavelength range light pixel, second initial layout data indicative of the initial arrangement position of the constituent element corresponding to the second wavelength range light pixel, and third initial layout data indicative of the initial arrangement position of the constituent element corresponding to the third wavelength range light pixel, in which the shrink rate data includes:

first shrink rate data indicative of a shrink rate of the constituent element corresponding to the first wavelength range light pixel, second shrink rate data indicative of a shrink rate of the constituent element corresponding to the second wavelength range light pixel and smaller in value than the first shrink rate data, and third shrink rate data indicative of a shrink rate of the constituent element corresponding to the third wavelength range light pixel and smaller in value than the second shrink rate data, in which the shrink layout data includes:

first shrink layout data indicative of an arrangement position where the initial arrangement position of the constituent element corresponding to the first wavelength range light pixel is shrunken, second shrink layout data indicative of an arrangement position where the initial arrangement position of the constituent element corresponding to the second wavelength range light pixel is shrunken, and third shrink layout data indicative of an arrangement position where the initial arrangement position of the constituent element corresponding to the third wavelength range light pixel is shrunken, in which the divided data includes:

first divided data corresponding to the first shrink layout data, second divided data corresponding to the second shrink layout data, and third divided data corresponding to the third shrink layout data, in which the integer data includes:

first integer data corresponding to the first divided data, second integer data corresponding to the second divided data, and third integer data corresponding to the third divided data, in which the corrected layout data includes:

first corrected layout data indicative of a correction position of the constituent element corresponding to the first wavelength range light pixel, second corrected layout data indicative of a correction position of the constituent element corresponding to the second wavelength range light pixel, and third corrected layout data indicative of a correction position of the constituent element corresponding to the third wavelength range light pixel, in which the (b) process calculates the first shrink layout data from the first initial layout data, based on the first shrink rate data, calculates the second shrink layout data from the second initial layout data, based on the second shrink rate data, and calculates the third shrink layout data from the third initial layout data, based on the third shrink rate data, in which the (c) process divides the first shrink layout data by the grid data to calculate the first divided data, divides the second shrink layout data by the grid data to calculate the second divided data, and divides the third shrink layout data by the grid data to calculate the third divided data, in which the (d) process performs integer processing on the first divided data to calculate the first integer data, performs integer processing on the second divided data to calculate the second integer data, and performs integer processing on the third divided data to calculate the third integer data, and in which the (e) process multiplies the grid data and the first integer data to thereby calculate the first corrected layout data, multiplies the grid data and the second integer data to thereby calculate the second corrected layout data, and multiplies the grid data and the third integer data to thereby calculate the third corrected layout data.

(Appendix 2)

A computer-readable recording medium that records the layout data generating program described in Appendix 1.

What is claimed is:

1. A solid-state imaging device, comprising:
(a) a plurality of pixels respectively having photoelectric conversion units each converting incident light into an electric charge and arranged in a matrix form in units of basic patterns; and
(b) an optical member arranged on the incidence side of the incident light than the pixels and having constituent elements respectively corresponding to the pixels;
wherein the pixels include:
(a1) a first wavelength range light pixel that makes first wavelength range light included in the incident light incident;
(a2) a second wavelength range light pixel that makes incident second wavelength rage light included in the incident light and shorter in wavelength than the first wavelength range light; and
(a3) a third wavelength range light pixel that makes incident third wavelength range light included in the incident light and shorter in wavelength than the second wavelength range light,
wherein each of the basic patterns is comprised of an arrangement pattern formed by combining the first wavelength range light pixel, the second wavelength range light pixel and the third wavelength range light pixel,
wherein a plurality of misregistration constituent elements in each of which misregistration occurs with respect to each of the photoelectric conversion units exist in the constituent elements configuring the optical member,
wherein in the misregistration constituent elements, the misregistration increases toward the misregistration constituent elements separated from a center position of a pixel array comprised of the pixels,
wherein in an arbitrary the basic pattern comprised of pixels corresponding to the misregistration constituent elements, the misregistration of the misregistration constituent element corresponding to the first wavelength range light pixel is smaller than the misregistration of the misregistration constituent element corresponding to the second wavelength range light pixel, and
wherein in the arbitrary the basic pattern, the misregistration of the misregistration constituent element corresponding to the third wavelength range light pixel is larger than the misregistration of the misregistration constituent element corresponding to the second wavelength range light pixel.

2. The solid-state imaging device according to claim 1,
wherein the optical member is a light shielding zone, and
wherein each of the constituent elements is a light penetration unit comprised of an opening provided in the light shielding zone.

3. The solid-state imaging device according to claim 1,
wherein the optical member is a color filter,
wherein of the constituent elements, the constituent element corresponding to the first wavelength range light pixel is a first wavelength range light penetration filter that allows the first wavelength range light to penetrate therethrough,
wherein of the constituent elements, the constituent element corresponding to the second wavelength range light pixel is a second wavelength range light penetration filter that allows the second wavelength range light to penetrate therethrough, and
wherein of the constituent elements, the constituent element corresponding to the third wavelength range light pixel is a third wavelength range light penetration filter that allows the third wavelength range light to penetrate therethrough.

4. The solid-state imaging device according to claim 1, wherein the optical member is a microlens group, and wherein each of the constituent elements is a microlens.

5. The solid-state imaging device according to claim 1, wherein the first wavelength range light is red light, wherein the second wavelength range light is green light, wherein the third wavelength range light is blue light, wherein the first wavelength range light pixel is a red light pixel, wherein the second wavelength range light pixel is a green light pixel, and wherein the third wavelength range light pixel is a blue light pixel.

6. The solid-state imaging device according to claim 1, wherein each of the photoelectric conversion units is comprised of a photodiode.

7. A layout data generating device for generating layout data indicative of arrangement positions of a plurality of constituent elements configuring an optical member of a solid-state imaging device, comprising:
a plurality of pixels respectively having photoelectric conversion units each converting incident light into an electric charge and arranged in a matrix form in units of basic patterns; and
the optical member arranged on the incidence side of the incident light than the pixels and having the constituent elements respectively corresponding to the pixels,
wherein the pixels include:
a first wavelength range light pixel that makes first wavelength range light included in the incident light incident;
a second wavelength range light pixel that makes incident second wavelength range light included in the incident light and shorter in wavelength than the first wavelength range light; and
a third wavelength range light pixel that makes incident third wavelength range light included in the incident light and shorter in wavelength than the second wavelength range light,
wherein each of the basic patterns is comprised of an arrangement pattern formed by combining the first wavelength range light pixel, the second wavelength range light pixel and the third wavelength range light pixel,
wherein the layout data generating device includes:
(a) an input unit that inputs therein initial layout data indicative of respective initial arrangement positions of the constituent elements arranged in the same positions as the photoelectric conversion units planarly, and shrink rate data indicative of rates at which the respective arrangement positions of the constituent elements are shrunken;
(b) a shrink layout data operation unit that calculates shrink layout data indicative of arrangement positions where the initial arrangement positions are shrunken, from the initial layout data, based on the shrink rate data inputted to the input unit;
(c) a division operation unit that divides the shrink layout data by grid data indicative of a unit to digitize the shrink layout data to calculate divided data;
(d) an integer operation unit that performs integer processing on the divided data when numeric data after a decimal point is included in the divided data, to calculate integer data;

(e) a corrected layout data operation unit that multiplies the grid data and the integer data to thereby calculate corrected layout data indicative of the digitized shrink layout data; and
(f) an output unit that outputs the corrected layout data,
wherein the initial layout data includes:
first initial layout data indicative of the initial arrangement position of the constituent element corresponding to the first wavelength range light pixel;
second initial layout data indicative of the initial arrangement position of the constituent element corresponding to the second wavelength range light pixel; and
third initial layout data indicative of the initial arrangement position of the constituent element corresponding to the third wavelength range light pixel,
wherein the shrink rate data includes:
first shrink rate data indicative of a shrink rate of the constituent element corresponding to the first wavelength range light pixel;
second shrink rate data indicative of a shrink rate of the constituent element corresponding to the second wavelength range light pixel and smaller in value than the first shrink rate data; and
third shrink rate data indicative of a shrink rate of the constituent element corresponding to the third wavelength range light pixel and smaller in value than the second shrink rate data,
wherein the shrink layout data includes:
first shrink layout data indicative of an arrangement position where the initial arrangement position of the constituent element corresponding to the first wavelength range light pixel is shrunken;
second shrink layout data indicative of an arrangement position where the initial arrangement position of the constituent element corresponding to the second wavelength range light pixel is shrunken; and
third shrink layout data indicative of an arrangement position where the initial arrangement position of the constituent element corresponding to the third wavelength range light pixel is shrunken,
wherein the divided data includes:
first divided data corresponding to the first shrink layout data;
second divided data corresponding to the second shrink layout data; and
third divided data corresponding to the third shrink layout data,
wherein the integer data includes:
first integer data corresponding to the first divided data;
second integer data corresponding to the second divided data; and
third integer data corresponding to the third divided data,
wherein the corrected layout data includes:
first corrected layout data indicative of a correction position of the constituent element corresponding to the first wavelength range light pixel;
second corrected layout data indicative of a correction position of the constituent element corresponding to the second wavelength range light pixel; and
third corrected layout data indicative of a correction position of the constituent element corresponding to the third wavelength range light pixel,
wherein the shrink layout data operation unit calculates the first shrink layout data from the first initial layout data, based on the first shrink rate data, calculates the second shrink layout data from the second initial layout data, based on the second shrink rate data, and calculates the third shrink layout data from the third initial layout data, based on the third shrink rate data, wherein the division operation unit divides the first shrink layout data by the grid data to calculate the first divided data, divides the second shrink layout data by the grid data to calculate the second divided data, and divides the third shrink layout data by the grid data to calculate the third divided data, wherein the integer operation unit performs integer processing on the first divided data to calculate the first integer data, performs integer processing on the second divided data to calculate the second integer data, and performs integer processing on the third divided data to calculate the third integer data, and wherein the corrected layout data operation unit multiplies the grid data and the first integer data to thereby calculate the first corrected layout data, multiplies the grid data and the second integer data to thereby calculate the second corrected layout data, and multiplies the grid data and the third integer data to thereby calculate the third corrected layout data.

8. The layout data generating device according to claim 7, wherein the initial layout data is comprised of a plurality of first coordinate data indicative of respective positions of the constituent elements in a first direction with a center position of a pixel array comprised of the pixels as a reference, and a plurality of second coordinate data indicative of respective positions of the constituent elements in a second direction orthogonal to the first direction, and wherein the shrink layout data and the corrected layout data are also comprised of a plurality of first coordinate data and a plurality of second coordinate data.

9. The layout data generating device according to claim 8, wherein the shrink layout data operation unit multiplies the first coordinate data of the initial layout data by the shrink rate data to thereby calculate the first coordinate data of the shrink layout data, respectively, and wherein the shrink layout data operation unit multiplies the second coordinate data of the initial layout data by the shrink rate data to thereby calculate the second coordinate data of the shrink layout data, respectively.

10. The layout data generating device according to claim 7, wherein the integer operation unit calculates the integer data by the process of rounding down the numeric data after the decimal point included in the divided data.

11. The layout data generating device according to claim 7, wherein the integer operating unit calculates the integer data by the process of rounding up the numeric data after the decimal point included in the divided data.

12. The layout data generating device according to claim 7, wherein the integer operation unit calculates the integer data by the process of rounding off the numeric data after the decimal point included in the divided data.

13. The layout data generating device according to claim 7, wherein the optical member is a light shielding zone, and wherein each of the constituent elements is a light penetration unit comprised of an opening provided in the light shielding zone.

14. The layout data generating device according to claim 13, further including a shielding pattern data generating unit that generates light shielding pattern data indicative of a pattern of the light shielding zone, wherein the shielding pattern data generating unit performs arithmetic processing based on the corrected layout data calculated by the corrected layout data operation unit on solid pattern data taken as the base of each light shielding pattern to thereby generate the light shielding pattern data.

15. The layout data generating device according to claim 7, wherein the optical member is a color filter, wherein of the constituent elements, the constituent element corresponding to the first wavelength range light pixel is a first wavelength range light penetration filter that allows first wavelength range light to penetrate therethrough, wherein of the constituent elements, the constituent element corresponding to the second wavelength range light pixel is a second wavelength range light penetration filter that allows second wavelength range light to penetrate therethrough, and wherein of the constituent elements, the constituent element corresponding to the third wavelength range light pixel is a third wavelength range light penetration filter that allows third wavelength range light to penetrate therethrough.

16. The layout data generating device according to claim 7, wherein the optical member is a microlens group, and wherein each of the constituent elements is a microlens.

17. The layout data generating device according to claim 7, wherein the first wavelength range light is red light, wherein the second wavelength range light is green light, wherein the third wavelength range light is blue light, wherein the first wavelength range light pixel is a red light pixel, wherein the second wavelength range light pixel is a green light pixel, and wherein the third wavelength range light pixel is a blue light pixel.

18. A layout data generating method for generating by a computer, layout data indicative of arrangement positions of a plurality of constituent elements configuring an optical member of a solid-state imaging device including:

a plurality of pixels respectively having photoelectric conversion units each converting incident light into an electric charge and arranged in a matrix form in units of basic patterns; and the optical member arranged on the incidence side of the incident light than the pixels and having the constituent elements respectively corresponding to the pixels, wherein the pixels include:

a first wavelength range light pixel that makes first wavelength range light included in the incident light incident;

a second wavelength range light pixel that makes incident second wavelength range light included in the incident light and shorter in wavelength than the first wavelength range light; and a third wavelength range light pixel that makes incident third wavelength range light included in the incident light and shorter in wavelength than the second wavelength range light, wherein each of the basic patterns is comprised of an arrangement pattern formed by combining the first wavelength range light pixel, the second wavelength range light pixel and the third wavelength range light pixel, the layout data generating method comprising the steps of:
(a) inputting to an input unit of the computer, initial layout data indicative of respective initial arrangement positions of the constituent elements arranged in the same positions as the photoelectric conversion units planarly, and shrink rate data indicative of rates at which the respective arrangement positions of the constituent elements are shrunken;
(b) calculating by a shrink layout data operation unit of the computer, shrink layout data indicative of arrangement positions where the initial arrangement positions are shrunken, from the initial layout data, based on the shrink rate data inputted to the input unit;
(c) dividing the shrink layout data by grid data indicative of a unit to digitize the shrink layout data to calculate divided data by a division operation unit of the computer;
(d) when numeric data after a decimal point is included in the divided data, performing integer processing on the divided data to calculate integer data by an integer operation unit of the computer;
(e) multiplying the grid data and the integer data to thereby calculate corrected layout data indicative of the digitized shrink layout data by a corrected layout data operation unit of the computer; and
(f) outputting the corrected layout data by an output unit of the computer,
wherein the initial layout data includes:
first initial layout data indicative of the initial arrangement position of the constituent element corresponding to the first wavelength range light pixel;
second initial layout data indicative of the initial arrangement position of the constituent element corresponding to the second wavelength range light pixel; and
third initial layout data indicative of the initial arrangement position of the constituent element corresponding to the third wavelength range light pixel,
wherein the shrink rate data includes:
first shrink rate data indicative of a shrink rate of the constituent element corresponding to the first wavelength range light pixel;
second shrink rate data indicative of a shrink rate of the constituent element corresponding to the second wavelength range light pixel and smaller in value than the first shrink rate data; and
third shrink rate data indicative of a shrink rate of the constituent element corresponding to the third wavelength range light pixel and smaller in value than the second shrink rate data,
wherein the shrink layout data includes:
first shrink layout data indicative of an arrangement position where the initial arrangement position of the constituent element corresponding to the first wavelength range light pixel is shrunken;
second shrink layout data indicative of an arrangement position where the initial arrangement position of the constituent element corresponding to the second wavelength range light pixel is shrunken; and
third shrink layout data indicative of an arrangement position where the initial arrangement position of the constituent element corresponding to the third wavelength range light pixel is shrunken,
wherein the divided data includes:
first divided data corresponding to the first shrink layout data;
second divided data corresponding to the second shrink layout data; and
third divided data corresponding to the third shrink layout data,
wherein the integer data includes:
first integer data corresponding to the first divided data;
second integer data corresponding to the second divided data, and
third integer data corresponding to the third divided data,
wherein the corrected layout data includes:
first corrected layout data indicative of a correction position of the constituent element corresponding to the first wavelength range light pixel;
second corrected layout data indicative of a correction position of the constituent element corresponding to the second wavelength range light pixel; and
third corrected layout data indicative of a correction position of the constituent element corresponding to the third wavelength range light pixel,
wherein the (b) step calculates the first shrink layout data from the first initial layout data, based on the first shrink rate data,
calculates the second shrink layout data from the second initial layout data, based on the second shrink rate data, and
calculates the third shrink layout data from the third initial layout data, based on the third shrink rate data,
wherein the (c) step divides the first shrink layout data by the grid data to calculate the first divided data,
divides the second shrink layout data by the grid data to calculate the second divided data, and
divides the third shrink layout data by the grid data to calculate the third divided data,
wherein the (d) step performs integer processing on the first divided data to calculate the first integer data,
performs integer processing on the second divided data to calculate the second integer data, and
performs integer processing on the third divided data to calculate the third integer data, and
wherein the (e) step multiplies the grid data and the first integer data to thereby calculate the first corrected layout data,
multiplies the grid data and the second integer data to thereby calculate the second corrected layout data, and
multiplies the grid data and the third integer data to thereby calculate the third corrected layout data.

* * * * *